(12) United States Patent
Bhattacharyya et al.

(10) Patent No.: US 7,968,960 B2
(45) Date of Patent: *Jun. 28, 2011

(54) METHODS OF FORMING STRAINED SEMICONDUCTOR CHANNELS

(75) Inventors: Arup Bhattacharyya, Essex Junction, VT (US); Leonard Forbes, Corvallis, OR (US); Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 347 days.

This patent is subject to a terminal disclaimer.

(21) Appl. No.: 11/506,986

(22) Filed: Aug. 18, 2006

(65) Prior Publication Data

US 2008/0042211 A1 Feb. 21, 2008

(51) Int. Cl.
H01L 21/76 (2006.01)
H01L 21/425 (2006.01)
(52) U.S. Cl. ........ 257/431; 438/423; 438/430; 438/528; 257/E21.547
(58) Field of Classification Search .................. 438/528, 438/427, 424, 430, 423, 431, 433, 199, 473, 438/474; 257/E21.546, E21.547
See application file for complete search history.

(56) References Cited

U.S. PATENT DOCUMENTS

| | | | |
|---|---|---|---|
| 5,461,243 A | 10/1995 | Ek et al. | |
| 5,759,898 A | 6/1998 | Ek et al. | |
| 5,879,996 A | 3/1999 | Forbes | |
| 5,963,817 A | 10/1999 | Chu et al. | |
| 5,976,952 A * | 11/1999 | Gardner et al. | 438/440 |
| 6,228,694 B1 | 5/2001 | Doyle et al. | |
| 6,251,751 B1 | 6/2001 | Chu et al. | |
| 6,261,876 B1 | 7/2001 | Crowder et al. | |
| 6,274,460 B1 | 8/2001 | Delgado et al. | |
| 6,455,397 B1 | 9/2002 | Belford | |
| 6,514,836 B2 | 2/2003 | Belford | |
| 6,515,335 B1 | 2/2003 | Christiansen et al. | |
| 6,593,625 B2 | 7/2003 | Christiansen et al. | |
| 6,649,492 B2 | 11/2003 | Chu et al. | |
| 6,657,276 B1 | 12/2003 | Karlsson et al. | |
| 6,689,671 B1 | 2/2004 | Yu et al. | |
| 6,703,648 B1 | 3/2004 | Xiang et al. | |
| 6,717,216 B1 | 4/2004 | Doris et al. | |
| 6,740,913 B2 | 5/2004 | Doyle et al. | |
| 6,855,649 B2 | 2/2005 | Christiansen et al. | |
| 6,900,521 B2 | 5/2005 | Forbes et al. | |
| 6,902,616 B1 | 6/2005 | Yamazaki et al. | |
| 6,987,037 B2 | 1/2006 | Forbes | |
| 7,023,051 B2 | 4/2006 | Forbes | |

(Continued)

OTHER PUBLICATIONS

"Cornell Demonstrates a Universal Substrate", *Compound Semiconductor*, 3(2), (Mar./Apr. 1997),27-29.

(Continued)

*Primary Examiner* — Shouxiang Hu
(74) *Attorney, Agent, or Firm* — Schwegman, Lundberg & Woessner, P.A.

(57) ABSTRACT

In various method embodiments, a device region in a semiconductor substrate and isolation regions adjacent to the device region are defined. The device region has a channel region and the isolation regions have strain-inducing regions laterally adjacent to the channel regions. The channel region is strained with a desired strain for carrier mobility enhancement, where at least one ion type is implanted with an energy resulting in a peak implant in the strain-inducing regions of the isolation regions. Other aspects and embodiments are provided herein.

66 Claims, 22 Drawing Sheets

U.S. PATENT DOCUMENTS

| | | | |
|---|---|---|---|
| 7,041,575 B2 | 5/2006 | Forbes | |
| 7,045,874 B2 | 5/2006 | Forbes | |
| 7,081,395 B2 | 7/2006 | Chi et al. | |
| 7,084,429 B2 | 8/2006 | Forbes | |
| 7,335,545 B2 * | 2/2008 | Currie | 438/197 |
| 7,485,544 B2 * | 2/2009 | Forbes et al. | 438/427 |
| 7,494,906 B2 * | 2/2009 | Kammler et al. | 438/528 |
| 2002/0135020 A1 | 9/2002 | Skotnicki et al. | |
| 2002/0163045 A1 | 11/2002 | Farrar | |
| 2002/0185686 A1 | 12/2002 | Christiansen et al. | |
| 2003/0013323 A1 | 1/2003 | Hammond et al. | |
| 2003/0201468 A1 | 10/2003 | Christiansen et al. | |
| 2003/0218189 A1 | 11/2003 | Christiansen et al. | |
| 2004/0113174 A1 * | 6/2004 | Chidambarrao et al. | 257/200 |
| 2004/0173798 A1 | 9/2004 | Forbes | |
| 2004/0212035 A1 * | 10/2004 | Yeo et al. | 257/510 |
| 2004/0217352 A1 | 11/2004 | Forbes | |
| 2004/0217391 A1 | 11/2004 | Forbes | |
| 2004/0221792 A1 | 11/2004 | Forbes | |
| 2004/0224480 A1 | 11/2004 | Forbes | |
| 2004/0232422 A1 | 11/2004 | Forbes | |
| 2004/0232487 A1 | 11/2004 | Forbes | |
| 2004/0232488 A1 | 11/2004 | Forbes | |
| 2004/0235264 A1 | 11/2004 | Forbes | |
| 2005/0020094 A1 | 1/2005 | Forbes et al. | |
| 2005/0023529 A1 | 2/2005 | Forbes | |
| 2005/0023612 A1 | 2/2005 | Forbes | |
| 2005/0023616 A1 | 2/2005 | Forbes | |
| 2005/0029619 A1 | 2/2005 | Forbes | |
| 2005/0032296 A1 | 2/2005 | Forbes | |
| 2005/0087842 A1 | 4/2005 | Forbes | |
| 2005/0247972 A1 | 11/2005 | Forbes | |
| 2005/0276117 A1 | 12/2005 | Forbes | |
| 2005/0285139 A1 | 12/2005 | Forbes | |
| 2006/0001094 A1 | 1/2006 | Forbes | |
| 2006/0011982 A1 | 1/2006 | Forbes | |
| 2006/0022282 A1 * | 2/2006 | Wirbeleit et al. | 257/403 |
| 2006/0097281 A1 | 5/2006 | Forbes | |
| 2007/0015347 A1 * | 1/2007 | Mehta et al. | 438/514 |
| 2007/0108529 A1 * | 5/2007 | Huang et al. | 257/368 |
| 2008/0029840 A1 | 2/2008 | Forbes et al. | |
| 2009/0108363 A1 | 4/2009 | Forbes et al. | |

OTHER PUBLICATIONS

Abe, T , "Silicon Wafer-Bonding Process Technology for SOI Structures", *Extended Abstracts of the 22nd (1990 International) Conference on Solid State Devices and Materials*, (1990),853-856.

Aberg, I , et al., "Electron and hole mobility enhancements in sub-10 nm-thick strained silicon directly on insulator fabricated by a bond and etch-back technique", *2004 Symposium on VLSI Technology Digest of Technical Papers*, (Jun. 2004),52-53.

Aberg, I. , et al., "High electron and hole mobility enhancements in thin-body strained Si/strained SiGe/strained Si heterostructures on insulator", *IEEE International Electron Devices Meeting, 2004. IEDM Technical Digest.*, (Dec. 2004),173-176.

Ang, Kah W., "Enhanced performance in 50 nm N-MOSFETs with silicon-carbon source/drain regions", *IEEE International Electron Devices Meeting, 2004. IEDM Technical Digest.*, (Dec. 2004), 1069-1071.

Ashok, S. , "Helium-Induced Nanocavities in Silicon: Formation, Properties and Applications", *Proc. 11th International Workshop on Physics of Semiconductor Devices*, (2001),255-261.

Belford, Rona E., et al., "Performance-Augmented CMOS Using Back-End Uniaxial Strain", *IEEE 60th DRC. Conference Digest Device Research Conference*, 2002, (Jun. 24-26, 2002),41-42.

Berti, M. , "Composition and Structure of Si-Ge Layers Produced by Ion Implantation and Laser Melting", *Journal of Materials Research*, 6(10), (Oct. 1991),2120-2126.

Berti, M. , "Laser Induced Epitaxial Regrowth of $Si_{1-x}Ge_x$/Si Layers Produced by Ge Ion mplantation", *Applied Surface Science*, 43, (1989), 158-164.

Bhattacharyya, Arup , et al., "Devices and Methods to Improve Carrier Mobility", U.S. Appl. No. 11/398,809, filed Apr. 6, 2006.

Biever, Celeste , "Secret of 'strained silicon' revealed: behind closed doors, Intel has perfected a novel way to improve chip performance.", *New Scientist*, 180(i2426-2428), (Dec. 20, 2003),27.

Cai, J. , "Performance Comparison and Channel Length Scaling of Strained Si FETs on SiGe-On-Insulator (SGOI)", *IEEE International Electron Devices Meeting, 2004. IEDM Technical Digest.*, (Dec. 2004),165-168.

Cartagena, E , et al., "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ,(1993),191.

Chen, Xiangdong , et al., "Vertical P-MOSFETs with heterojunction between source/drain and channel", *IEEE Device Research Conference*, 2000,25-26.

Chilton, B T., et al., "Solid phase epitaxial regrowth strained $Si_{1-x}Ge_x$/Si strained layer structures amorphized by ion implantation", *Applied Physics Letters*, 54(1), (Jan. 2, 1989),42-44.

Chleirigh, C. N., "Mobility and Sub-threshold Characteristics in High-Mobility Dual-Channel Strained Si/Strained SiGe P-MOSFETs", *IEEE Device Research Conference*, Santa Barbara, CA Jun. 20-22, 2005,203-204.

Choe, K. S., et al., "Minority-Carrier Lifetime Optimization in Silicon MOS Devices by Intrinsic Gettering", *Journal of Crystal Growth*, 218(2-4), (Sep. 2000),239-44.

Chu, T. L., et al., "Films of silicon nitride-silicon dioxide mixtures", *J. Electrochem. Soc.*, 115, (1968),318-321.

Clark, Don , et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96. Proceedings of the 26th European Solid State Device Research Conference*, (Sep. 1996),519-22.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998),13-17.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Forbes, L. , "Localized Compressive Strained Semiconductor", U.S. Appl. No. 11/356,335, filed Feb. 16, 2006.

Forbes, L. , "Micromechanical Strained Semiconductor by Wafer Bonding", U.S. Appl. No. 11/432,578, filed May 11, 2006.

Forbes, L. , "Micromechanically Strained Microconductor Film", U.S. Appl. No. 10/379,749, filed Mar. 5, 2003.

Forbes, Leonard , "Non-Volatile Memory Device With Tensile Strained Silicon Layer", U.S. Appl. No. 11/260,339, filed Oct. 27, 2005 26 pages.

Forbes, L., et al., "Strained Semiconductor by Full Wafer Bonding", U.S. Appl. No. 11/475,798, filed Jun. 27, 2006.

Fournel, F , et al., "Ultra High Precision Of The Tilt/Twist Misorientation Angles In Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Ghani, T. , "A 90nm High Volume Manufacturing Logic Technology Featuring Novel 45nm Gate Length Strained Silicon CMOS Transistors", *Technical Digest IEEE International Electron Devices Meeting*, (Dec. 2003),978-980.

Goto, K. , "Technology Booster using Strain-Enhancing Laminated SiN (SELS) for 65nm Node Hp MPUs", *IEDM Technical Digest. IEEE International Electron Devices Meeting*, (Dec. 2004),209-212.

Haddad, H. , et al., "Carbon Doping Effects on Hot Electron Trapping", *28th Annual Proceedings. Reliability Physics 1990*, (Mar. 1990),288-9.

Irie, H. , et al., "In-plane mobility anisotropy and universality under uni-axial strains in nand p-MOS Iinversion Layers on (100), [110], and (111) Si", *IEEE International Electron Devices Meeting, 2004. IEDM Technical Digest.*, (Dec. 2004),225-228.

Kal, S. , et al., "Strained Silicon-SiGe Devices Using Germanium Implantation", *IETE Journal of Research*, 43 (2-3), (Mar. 1997), 185-192.

Kalavade, Pranav, et al., "A novel sub-10 nm transistor", *58th DRC. Device Research Conference. Conference Digest*, (Jun. 19-21, 2000),71-72.

Kawasaki, Hirohisa, "Impact of Parasitic Resistance and Silicon Layer Thickness Scaling for Strained-Silicon MOSFETs on Relaxed Si1-xGex virtual substrate", *IEEE International Electron Devices Meeting, 2004. IEDM Technical Digest.*, (Dec. 2004),169-172.

Komoda, T., "Mobility Improvement for 45nm Node by Combination of Optimized Stress Control and Channel Orientation Design", *IEEE International Electron Devices Meeting, 2004. IEDM Technical Digest.*, (Dec. 2004),217-220.

Kostrzewa, M, et al., "Testing the Feasibility of strain relaxed InAsP and InGaAs compliant substrates", *EMC 2003 International Conference Indium Phosphide and Related Materials. Conference Proceedings*, (Jun. 2003),8.

Lasky, J. B., "Wafer Bonding for Silicon-on-Insulator Technologies", *Applied Physics Letters*, 48(1). (Jan. 6, 1986),78-80.

Maikap, S., "Package-strain-enhanced device and circuit performance", *IEEE International Electron Devices Meeting, 2004. IEDM Technical Digest.*, (Dec. 2004),233-236.

Mizuno, T, et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.

Moran, Peter, "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,pp. 8-9.

Nayak, D. K., "High performance GeSi quantum-well PMOS on SIMOX", *International Electron Devices Meeting 1992. Technical Digest*, (1992),777-780.

Ntsoenzok, E, et al., "Helium implant depth dependence on thermal growth of nanocavities in silicon", *SolidState and Integrated Circuits Technology. Proceedings. 7th International Conference on*, vol. 3, 18-21, (Oct. 2004),2382-86

Numata, Toshinori, "Performance Enhancement of Partially-and Fully-Depleted Strained-SOI MOSFETs and Characterization of Strained-Si Device Parameters", *IEEE International Electron Devices Meeting, 2004. IEDM Technical Digest.*, (Dec. 2004), 177-180.

O'Neill, A G., et al., "High speed deep sub-micron MOSFET using high mobility strained silicon channel", *ESSDERC '95. Proceedings of the 25th European Solid State Device Research Conference*, (Sep. 1995),109-12.

Omi, Hiroo, et al., "Semiconductor Surface with Strain Control", http://www.brl.ntt.co/jp/J/kouhou/katsudou/report00/E/report04_e.html.

Paine, D. C., et al., "The Growth of Strained $Si_{1-x}Ge_x$ Alloys on (100) Silicon Using Solid Phase Epitaxy", *Journal of Materials Research*, 5(5), (May 1990),1023-1031.

People, R., "Calculation of critical layer thickness versus lattice mismatch for $Ge_xSi_{1-x}$/Si strained-layer heterostructures", *Applied Physics Letters*, 47(3), (Aug. 1, 1985),322-324.

Pidin, S., "A Novel Strain Enhanced CMOS Architecture Using Selectively Deposited High Tensile and High Compressive Silicon Nitride Films", *IEEE International Electron Devices Meeting,2004. IEDM Technical Digest.*, (Dec. 2004),213-216.

Rangan, et al., "Formation and characterization of mulit-layer nanocavities in silicon with cascade helium implantation anneal", 1360-65.

Rangan, S., et al., "Helium-Induced Nanocavities in Silicon: Formation, Properties and Applications", *Proc. 11th International Workshop on Physics of Semiconductor Devices*, (Dec. 11-15, 2001),255-261.

Rim, Kern, et al., "Fabrication and analysis of deep submicron strained-Si n-MOSFET's", *IEEE Transactions on Electron Devices*, 47(7), (Jul. 2000),1406-1415.

Rim, Kern, et al., "Strained Si NMOSFETs for High Performance CMOS Technology", *2001 Symposium on VLSI Technology. Digest of Technical Papers*, (2001),59-60.

Rim, Kern, et al., "Transconductance enhancement in deep submicron strained Si n-MOSFETs", *International Electron Devices Meeting 1998. Technical Digest*, (1998),707-710.

Saggio, M., "Innovative Localized Lifetime Control in High-Speed IGBT's", *IEEE Electron Device Letters*, 18(7), (1997),333-335.

Subbanna, Seshadri, "High-Performance Silicon-Germanium Technology", *63rd Device Research Conference Digest*, 2005. DRC '05., (2005),195-196.

Sugiyama, N, et al., "Formation of strained-silicon layer on thin relaxed-SiGe/$SiO_2$/Si structure using SIMOX technology", *Thin Solid Films*, 369(1-2), Jul. 2000),199-202.

Takagi, Shin-Ichi, "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002),37-40.

Thompson, S. E., "Key Differences For Process-induced Uniaxial vs. Substrate-induced Biaxial Stressed Si and Ge Channel MOSFETs", *IEEE International Electron Devices Meeting, 2004. IEDM Technical Digest.*, (Dec. 2004),221-224.

Uchida, Ken, "Experimental Study of Biaxial and Uniaxial Strain Effects on Carrier Mobility in Bulk and Ultrathin-body SOI MOSFETs", *IEEE International Electron Devices Meeting, 2004. IEDM Technical Digest.*, (Dec. 2004),229-232.

Verdonckt-Vandebroek, S., et al., "SiGe-channel heterojunction p-MOSFETs", *IEEE Transactions on Electron Devices*, 41(1), (Jan. 1994),90-101.

Welser, J, "Strain dependence of the performance enhancement in strained-Si n-MOSFETs", *IEEE International Electron Devices Meeting 1994. Technical Digest*, (Dec. 11-14, 1994),373-376.

Xiao, Q., et al., "Preparation of thin Strained Si Film by Low Temperature Ge Ion Implantation and High Temperature Annealing", *Solid-State and Integrated Circuits Technology*, 2004. Proceedings 7th Int'l Conf., 3(3), (Oct. 18, 2004),2163-2166.

Yin, Haizhou, "High Ge-Conent Relaxed Sil-xGex Layers by Relaxation on Complaint Substrate with Controlled Oxidation", *Electronic Materials Conference*, Santa Barbara, Jun. 2002, (Jun. 2002),8.

* cited by examiner

METHODS OF FORMING STRAINED SEMICONDUCTOR CHANNELS

TECHNICAL FIELD

This disclosure relates generally to semiconductor devices, and more particularly, to strained semiconductor, devices and systems, and methods of forming the strained semiconductor, devices and systems.

BACKGROUND

The semiconductor industry continues to strive for improvements in the speed and performance of semiconductor devices. Strained silicon technology has been shown to enhance carrier mobility in both n-channel and p-channel devices, and thus has been of interest to the semiconductor industry as a means to improve device speed and performance. Currently, strained silicon layers are used to increase electron mobility in n-channel CMOS transistors. There has been research and development activity to increase the hole mobility of p-channel CMOS transistors using strained silicon germanium layers on silicon.

One approach involves a silicon germanium layer on a silicon substrate, and a silicon capping layer on the silicon germanium layer. Both the silicon germanium and the silicon capping layers are strained if they are thin. The crystalline silicon layer is strained by a lattice mismatch between the silicon germanium layer and the crystalline silicon layer. The silicon germanium layer may be graded to a relaxed or unstrained layer to create more stress in the silicon cap layer. Strained silicon layers have been fabricated on thicker relaxed silicon germanium layers to improve the mobility of electrons in NMOS transistors. Structures with strained silicon on silicon germanium on insulators have been described as well as structures with strained silicon over a localized oxide insulator region. These structures yield high mobility and high performance transistors on a low capacitance insulating substrate.

Known techniques to strain channels and improve carrier mobilities in CMOS devices include improving electron mobility in NMOS transistors using a tensile strained silicon layer on silicon germanium, improving hole mobility using silicon germanium source/drain regions in trenches adjacent to the PMOS transistor to introduce uniaxial compressive stress in the channel of the PMOS transistor, improving electron mobility using silicon-carbide source/drain regions in trenches adjacent to an NMOS transistor to introduce tensile stress, and improving mobility for both NMOS and PMOS transistors using silicon nitride capping layers formed to introduce tensile stress for NMOS transistors and formed to introduce compressive stress for PMOS transistors.

Wafer bending has been used to investigate the effect of strain on mobility and distinguish between the effects of biaxial stress and uniaxial stress. Bonding a semiconductor onto bowed or bent substrates has been disclosed to introduce strain in the semiconductor. Stress can also be introduced by wafer bonding. Packaging can introduce mechanical stress by bending. Compressively-strained semiconductor layers have been bonded to a substrate.

DETAILED DESCRIPTION

Figure 1A:
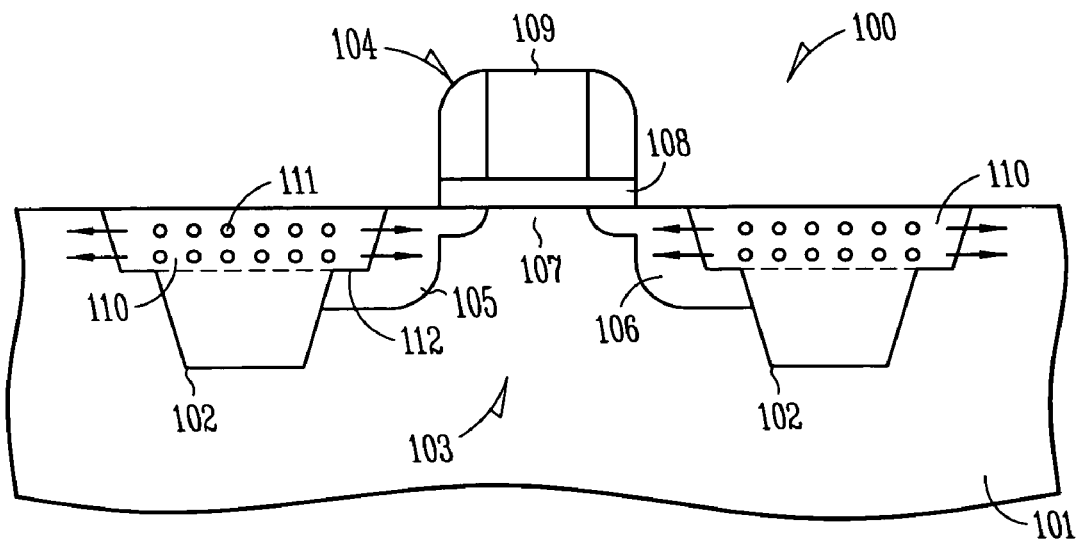
FIGS. 1A-1B illustrate p-channel transistor embodiments with a channel under compressive strain.

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Disclosed herein, among other things, is a process to adjust volumes of strain-induced regions of isolation regions to provide device channels regions with a desired strain. Thus, the strain-induced region is expanded to provide a compressive strain for p-channel device, and the strain-induced region is reduced or contracted to provide a tensile strain for n-channel devices. According to various embodiments, a depth of the strain-induced region generally corresponds to a depth of a channel region. In various embodiments, the depth of the strain-induced region is about 200 Å. In various embodiments, the depth of the strain-induced region is about 100 Å.

For example, some embodiments implant helium ions in an amorphous silicon device isolation regions to create nanocavities. Oxygen is selectively implanted into the PMOS isolation regions, and forms a silicon oxide ($SiO_x$) during a subsequent anneal. The formation of the silicon oxide expands the PMOS isolation regions, and thereby compressively strains the adjacent PMOS channel. Hydrogen and argon are selectively implanted into the NMOS isolation regions. An anneal after the implantation of hydrogen and argon recrystallizes the amorphous silicon in the NMOS isolation regions, compressing the NMOS isolation regions and thereby inducing tensile strain in the adjacent NMOS channel.

Various method embodiments strain the channel region with a desired strain for carrier mobility enhancement, including implanting at least one ion type with an energy resulting in a peak implant in the strain-inducing regions of the isolation regions. Various embodiments strain the channel region with a desired strain for carrier mobility enhancement, including forming nanocavities in the strain-inducing regions. Various embodiments strain the channel region with a desired tensile strain for electron mobility enhancement, including implanting helium in the strain-inducing regions, annealing to form nanocavities in the strain-inducing regions, implanting argon and hydrogen in the strain-inducing regions, and annealing to recrystallize the strain-inducing regions and tensilely strain the channel region. Various embodiments strain the channel region with a desired compressive strain for hole mobility enhancement, including implanting helium in the strain-inducing regions, annealing to form nanocavities in the strain-inducing regions, implanting oxygen in the strain-inducing regions, and annealing to form an oxide in the strain-inducing regions and compressively strain the channel region. In an embodiment, isolation regions are defined for both PMOS and NMOS, and silicon is etched to form isolation trenches. The outer-sidewalls of the trenches are selectively oxidized, where the inner sidewalls are protected by nitride. Amorphous silicon is deposited, and the surface is planarized. A shallow ion implant of helium (dose at least $3 \times 10^{20}$ ions/cm$^3$) only into the isolation regions to ensure implant distribution within 200 Å from the surface. The structure is annealed to create nanocavities. A thin oxide and nitride are deposited to seal the isolation surface. Prior to forming a gate oxide, oxygen is selectively implanted for the PMOS isolation region and hydrogen or hydrogen and Argon is selectively implanted for the NMOS region. The dose is at least $3 \times 10^{20}$ ions/cm$^3$ and the implant distribution is within 200 Å from the surface. Standard gate oxidation, post oxidation anneal, and gate and device processing can be performed. The thermal budget creates preferential oxidation of near-surface silicon at the helium-induced bubbles to induce compressive stress and strain for PMOS channels. Near-surface helium-hydrogen and argon bubble regions facilitate recrystallization of amorphous silicon at the near surface region for NMOS, shrinking the volume and inducing tensile stress and strain for the NMOS channel.

Various embodiments define isolation regions and amorphous silicon regions. A thin epitaxial silicon layer less than 1000 Å is formed on the surface of the silicon wafer. Helium is selectively implanted (with a dose greater than $3 \times 10^{20}$ ions/cm$^3$) for the PMOS region and Ar/H$_2$ (each with a dose greater than $3 \times 10^{20}$ ions/cm$^3$) for the NMOS region. The implant peak is confined to a depth corresponding to the thickness of the epitaxial layer and 100 Å into the substrate, and a distribution of +/−100 Å from the peak. The surface is sealed until the gate oxidation steps. Standard gate oxidation, post oxidation anneal, and gate and device processing can be performed. The thermal budget creates stable helium bubbles in the PMOS isolation regions to induce compressive stress/strain for PMOS, and recrystallizes and forms epitaxial silicon top-down to the damaged Argon/H2 region, inducing tensile stress/strain in the NMOS channel region.

Various structure embodiments include a device region and isolation regions adjacent to the device region. The device region includes a first source/drain region, a second source/drain region, and a channel region between the first source/drain region and the second source drain region. The isolation regions have strain-inducing regions laterally adjacent to the channel region and have a depth generally corresponding to a depth of the channel region. The channel region includes a strain induced by the strain-inducing regions in the isolation regions.

Various structure embodiments include a p-channel device and an n-channel device. The p-channel device includes a p-channel device region and p-channel isolation regions on opposing sides of the p-channel device region. The p-channel device region includes first and second source/drain regions and a p-channel region between the first and second source drain regions. The p-channel isolation regions have strain-inducing regions laterally adjacent to the p-channel region and have a depth generally corresponding to a depth of the p-channel region. The p-channel region includes a compressive strain induced by the strain-inducing regions in the p-channel isolation regions. The n-channel device includes an n-channel device region and n-channel isolation regions on opposing sides of the n-channel device region. The n-channel device region includes first and second source/drain regions and a n-channel region between the first and second source drain regions. The n-channel isolation regions have strain-inducing regions laterally adjacent to the n-channel region and having a depth generally corresponding to a depth of the n-channel region. The n-channel region includes a tensile strain induced by the strain-inducing regions in the n-channel isolation regions.

Various structure embodiments include a device region, a first isolation trench on a first side of the device region and a second isolation trench on a second side of the device region, and isolation regions adjacent to the device region. The device region includes a first source/drain region, a second source/drain region, and a channel region between the first source/drain region and the second source drain region. Each of the first and second isolation trenches have a strain-inducing region laterally adjacent to the channel region. The strain-inducing regions have a depth generally corresponding to a depth of the channel region. The isolation trenches have a stepped cross-sectional profile, where a step in the profile of the isolation trenches corresponds to a bottom of the strain-inducing region. The channel region includes a strain induced by the strain-inducing regions in the isolation regions.

Figure 1B:
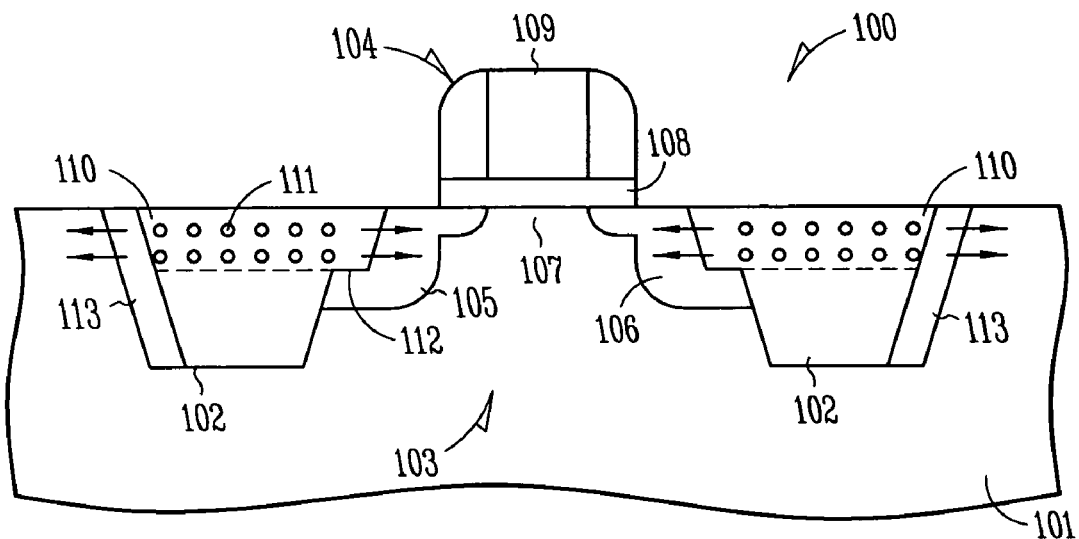

FIGS. 1A-1B illustrate p-channel transistor embodiments with a channel under compressive strain. The illustrated p-channel device 100 is formed in a substrate 101. For example, the substrate can be an n-doped crystalline silicon wafer or n-well in a crystalline silicon wafer. The present subject matter is not limited to silicon technology, however, as it can be implemented using germanium, compound semiconductors such as GaAs or InP, or other semiconductor technologies. Thus, for example, embodiments that specifically refer to silicon or amorphous silicon can be more generally referred to as a semiconductor or an amorphous semiconductor. An isolation region 102, also referred to as isolation regions or isolation trenches, isolates a device region 103 from other regions on the substrate. The transistor 104 is formed in the device region, and includes a first source/drain region 105, a second source/drain region 106, and a channel region 107 extending between the first and second source/drain regions. A gate stack is positioned over the channel region, and includes a gate insulator 108, such as silicon dioxide or silicon oxi-nitride, formed over the channel region and a gate 109 formed on the gate insulator. The present subject matter is not limited to a particular gate insulator or gate stack design.

The illustrated isolation trenches or regions include a strain-inducing region 110, as illustrated by the dotted line separating a top portion and bottom portion of the isolation region. The illustrated strain-inducing region has a depth that generally corresponds to a depth of the channel region. In the illustrated figures, ions are implanted into the strain-inducing region of the isolation region as part of a process to expand the strain-inducing region and compress the channel region. Various embodiments form nanocavities 111 in the strain-inducing region 110. FIG. 1A illustrates an embodiment in which the strain-inducing region expands in opposing directions, as illustrated by the arrows. FIG. 1B illustrates an embodiment in which an oxide 113 is on a wall of an isolation trench, and the strain-inducing region expands only near the channel, as illustrated by the arrows.

Figure 2A:
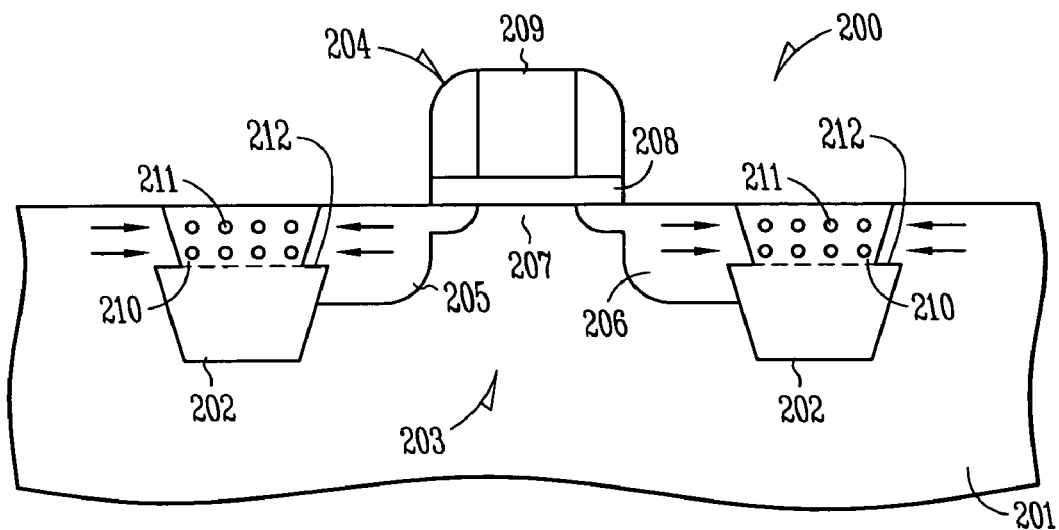
FIGS. 2A-2B illustrate n-channel transistor embodiments with a channel under tensile strain.
Figure 2B:
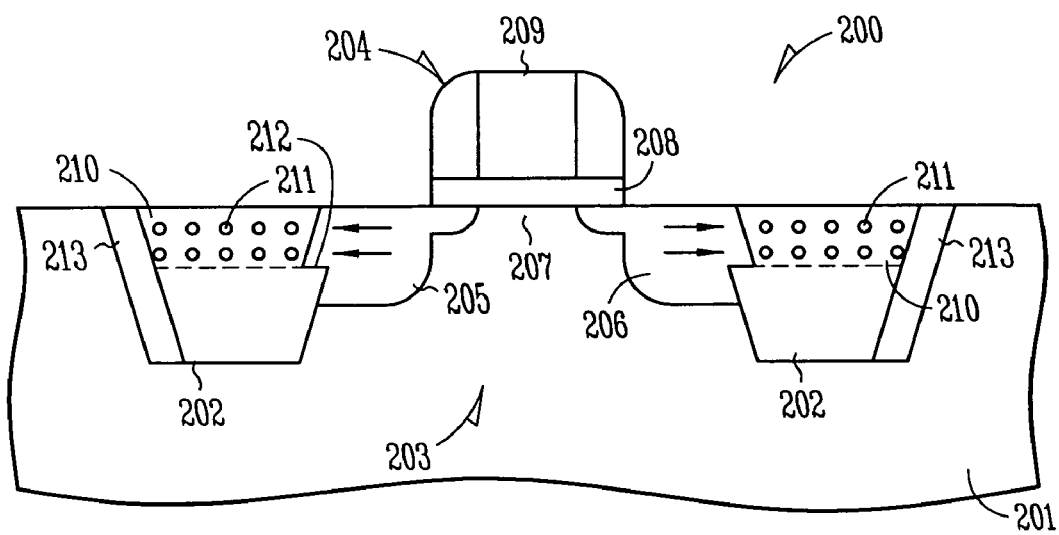

FIGS. 2A-2B illustrate n-channel transistor embodiments with a channel under tensile strain. The illustrated n-channel device 200 is formed in a substrate 201. For example, the substrate can be a p-doped crystalline silicon wafer or p-well in a crystalline silicon wafer. The present subject matter is not limited to silicon technology, however, as it can be implemented using germanium or other semiconductor technologies. An isolation region 202, also referred to as isolation regions or isolation trenches, isolates a device region 203 from other regions on the substrate. A transistor 204 is formed in the device region, and includes a first source/drain region 205, a second source/drain region 206, and a channel region 207 extending between the first and second source/drain regions. A gate stack is positioned over the channel region, and includes a gate insulator 208, such as silicon dioxide or silicon oxi-nitride, formed over the channel region and a gate 209 formed on the gate insulator.

The illustrated isolation regions or trenches 202 include a strain-inducing region 210, as illustrated by the dotted line separating a top portion and bottom portion of the isolation region. The illustrated strain-inducing region has a depth that generally corresponds to a depth of the channel region. In the illustrated figures, ions are implanted into the strain-inducing region of the isolation region as part of a process to contract the strain-inducing region and tensile strain the channel region. Various embodiments form nanocavities 211 in the strain-inducing region. FIG. 2A illustrates an embodiment in which the strain-inducing region contracts in opposing directions, as illustrated by the arrows. FIG. 2B illustrates an embodiment in which an oxide 213 is on a wall of an isolation trench, and the strain-inducing region contracts only near the channel region, as illustrated by the arrows.

The isolation trenches correspond to a first isolation region proximate to the first source/drain region and a second isolation region proximate to the second source drain region. These isolation regions or trenches can form part of an integrated isolation region (e.g. an isolation region surrounding an island device region). FIGS. 1A-1B and 2A-2B illustrate an isolation trench on opposing sides of the device region. Each isolation trench has a strain-inducing region laterally adjacent to the channel region. The strain-inducing region has a depth generally corresponding to a depth of the channel region. For example, the strain-inducing region can have a depth of approximately 200 Å or less or can have a depth of approximately 100 Å or less. The isolation trench has a stepped cross-sectional profile, where a step (112 or 212) in the profile of the isolation trenches corresponds to a bottom of the strain-inducing region. The step 112 illustrated in FIGS. 1A-1B steps outward corresponding to an expanded strain-inducing region 110; and the step 212 illustrated in FIGS. 2A-2B steps inward corresponding to a contracted strain-inducing region 210.

FIGS. 1A-B and 2A-B illustrate p-channel and n-channel devices, respectively. Examples of these devices include PMOS and NMOS devices. One of ordinary skill in the art would understand how to provide strained channels for other p-channel and n-channel devices, including non-volatile memories such as floating gate devices.

Figure 3A:
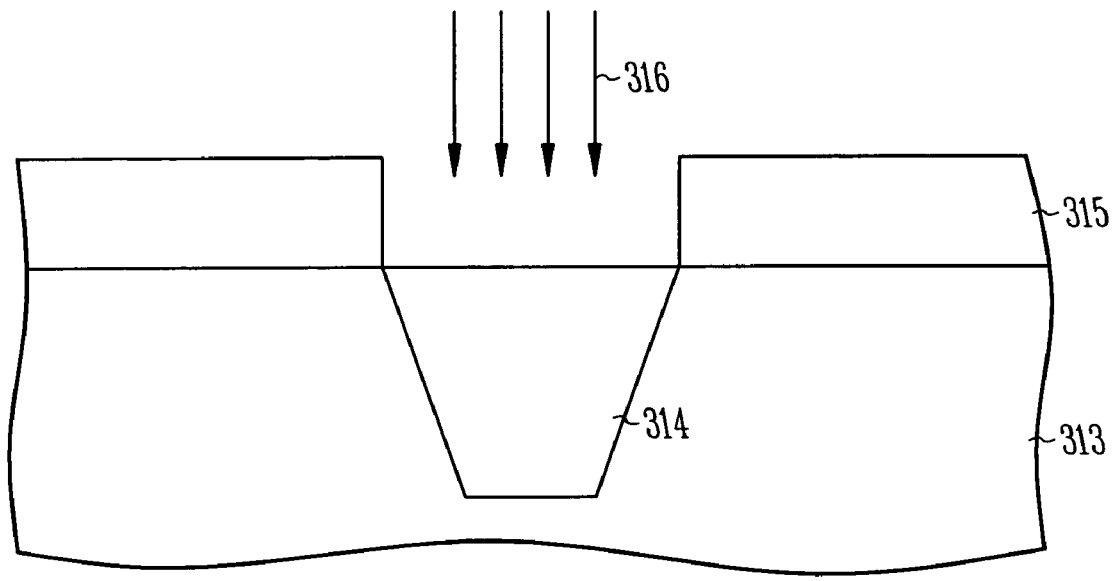
FIGS. 3A-3B illustrate a process to form nanocavities in stress-inducing regions of isolation regions, according to various embodiments.
Figure 3B:
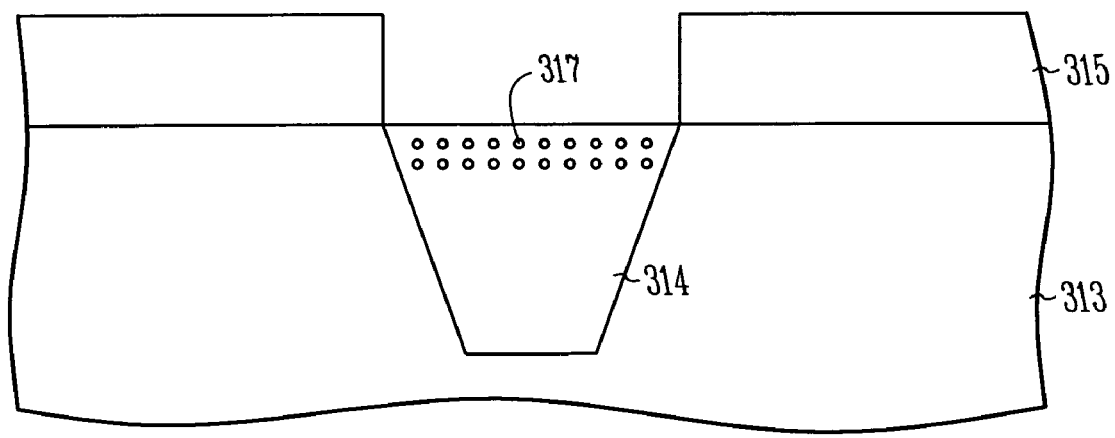

FIGS. 3A-3B illustrate a process to form nanocavities in stress-inducing regions of isolation regions, according to various embodiments. FIG. 3A illustrates a substrate 313, such as a silicon substrate, along with a defined isolation region 314. The illustrated isolation region 314 includes a trench in the silicon substrate, where the trench is filled with amorphous silicon. A mask 315 is positioned on the substrate and ions are implanted, as illustrated by arrows 316, into the substrate. The ions are implanted using an implant dose and energy to provide a desired distribution in a desired strain-inducing region. Various embodiments implant a noble element, such as helium. The structure is annealed, which transforms the implanted ions into nanocavities 317, as illustrated in FIG. 3B.

Figure 4A:
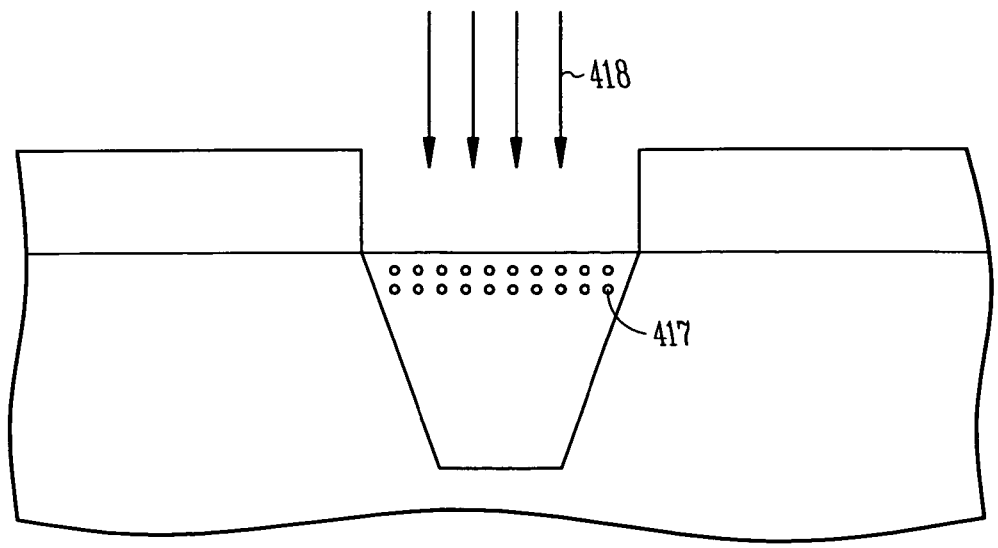
FIGS. 4A-4C illustrate a process to expand stress-inducing regions of isolation regions using the nanocavities formed in FIGS. 3A-3B, according to various embodiments.
Figure 4B:
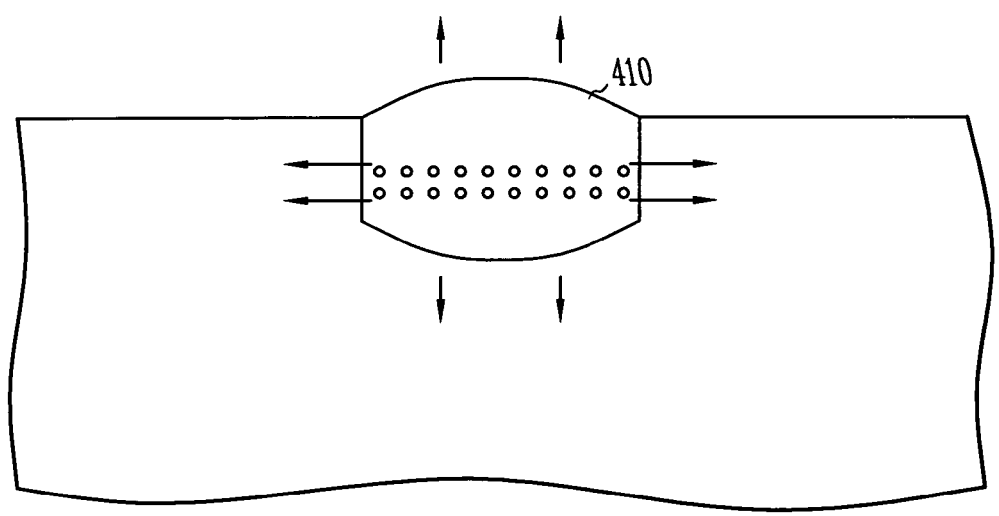
Figure 4C:
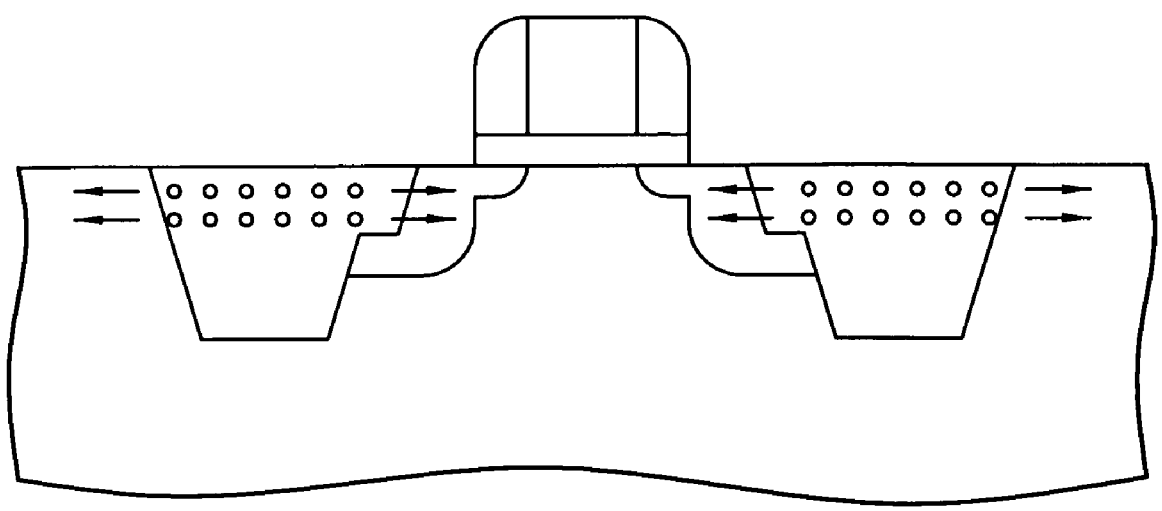

FIGS. 4A-4C illustrate a process to expand stress-inducing regions of isolation regions using the nanocavities formed in FIGS. 3A-3B, according to various embodiments. In the illustrated embodiment, oxygen ions are implanted, illustrated by arrows 418 in FIG. 4A, into the strain-inducing region of the amorphous silicon. A silicon oxide (SiO$_x$) forms around the nanocavities 417 when the structure is subsequently annealed, which causes the strain-inducing region 410 to expand as illustrated in FIG. 4B. A transistor device can be formed in the device region, as illustrated in FIG. 4C.

Figure 5A:
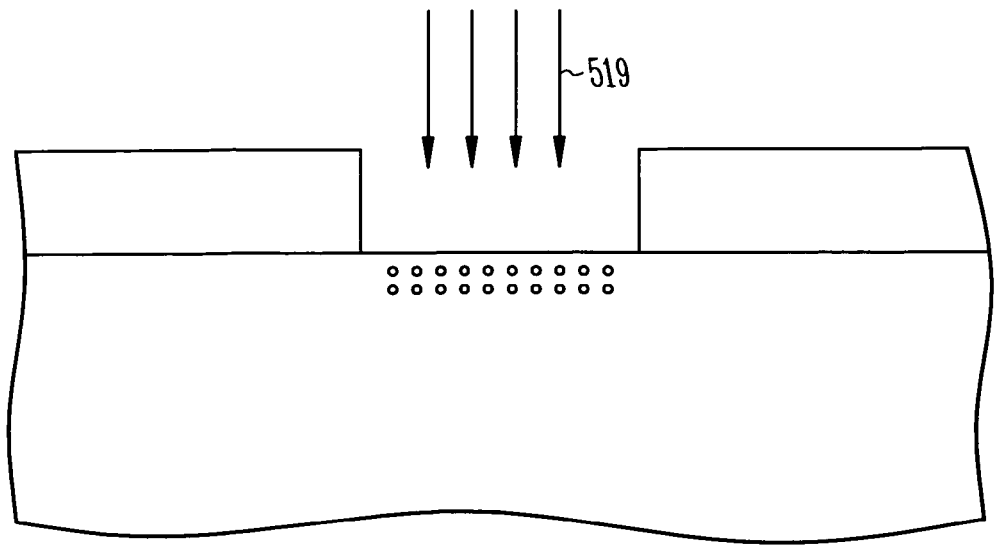
FIGS. 5A-5C illustrate a process to contract stress-inducing of isolation regions using the nanocavities formed in FIGS. 3A-3B, according to various embodiments.
Figure 5B:
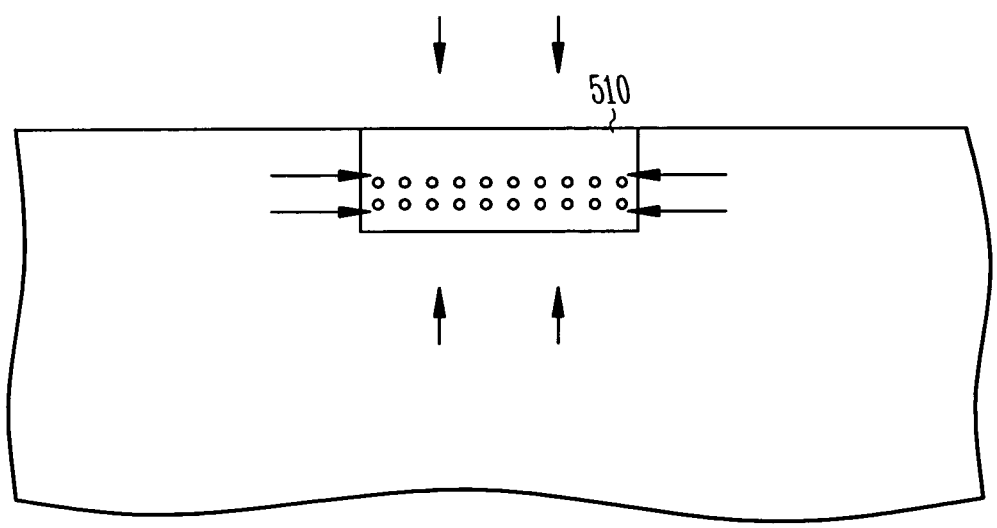
Figure 5C:
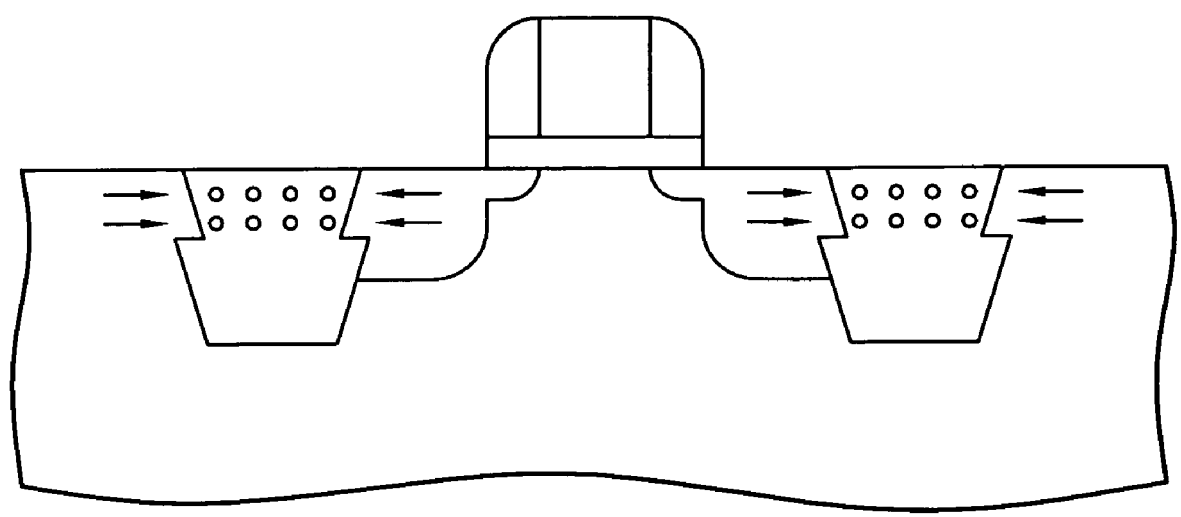

FIGS. 5A-5C illustrate a process to contract stress-inducing of isolation regions using the nanocavities formed in FIGS. 3A-3B, according to various embodiments. In the illustrated embodiment, argon and hydrogen ions are implanted, illustrated by arrows 519 in FIG. 5A, into the strain-inducing region of the amorphous silicon. The argon ions damage the amorphous silicon in preparation for recrystallization, and the hydrogen ions assist with the recrystallization by bonding to dangling silicon bonds. When the structure is subsequently annealed, the strain-inducing region 510 recrystallizes and contracts as illustrated in FIG. 5B. A transistor device can be formed in the device region, as illustrated in FIG. 5C.

Figure 6A:
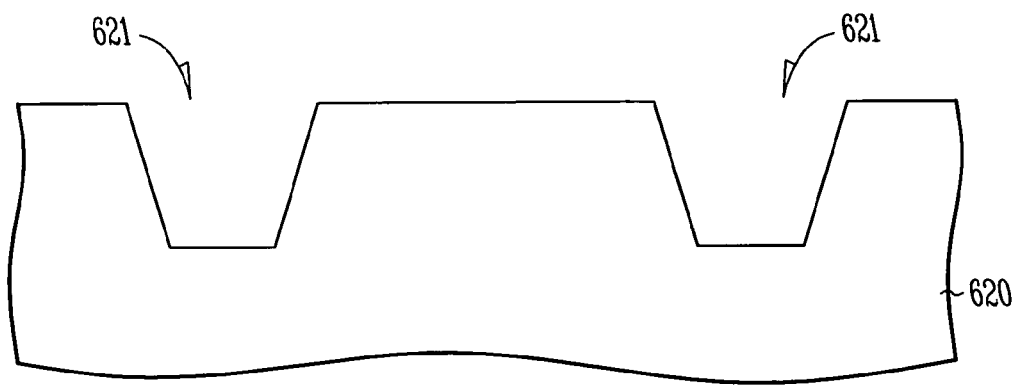
FIGS. 6A-6F illustrate a process to form nanocavities in stress-inducing regions of isolation regions, according to various embodiments.
Figure 6B:
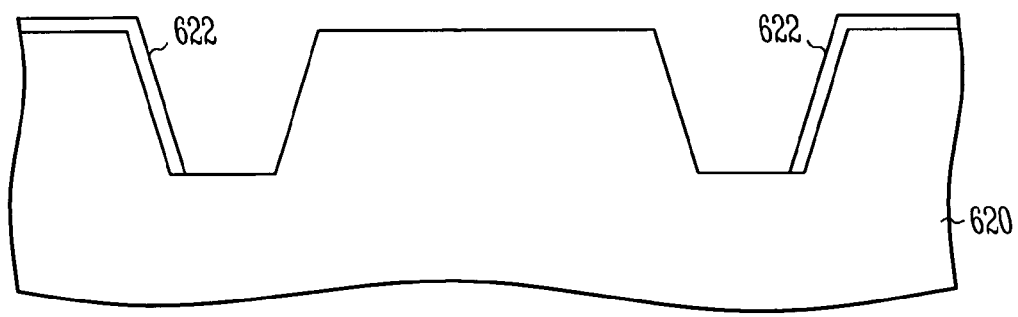
Figure 6C:
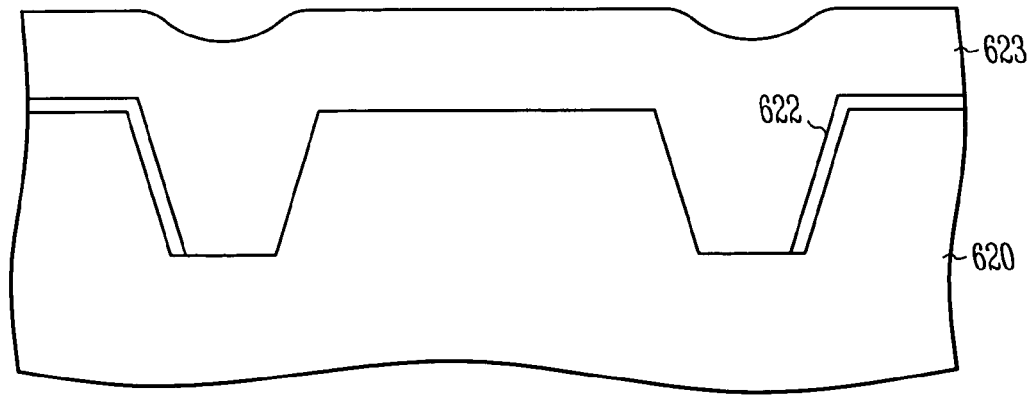
Figure 6D:
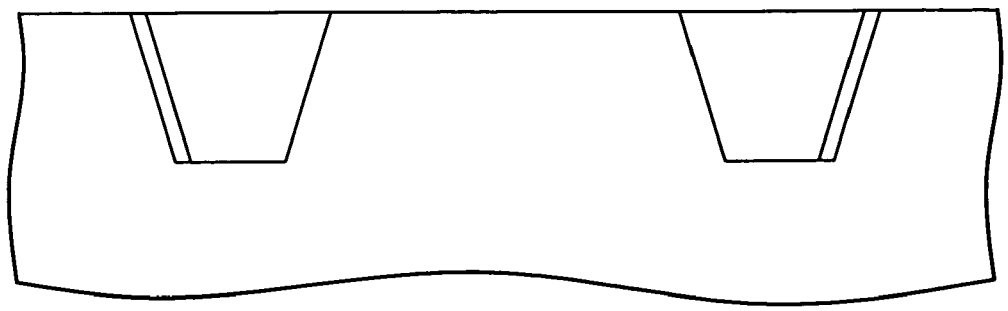
Figure 6E:
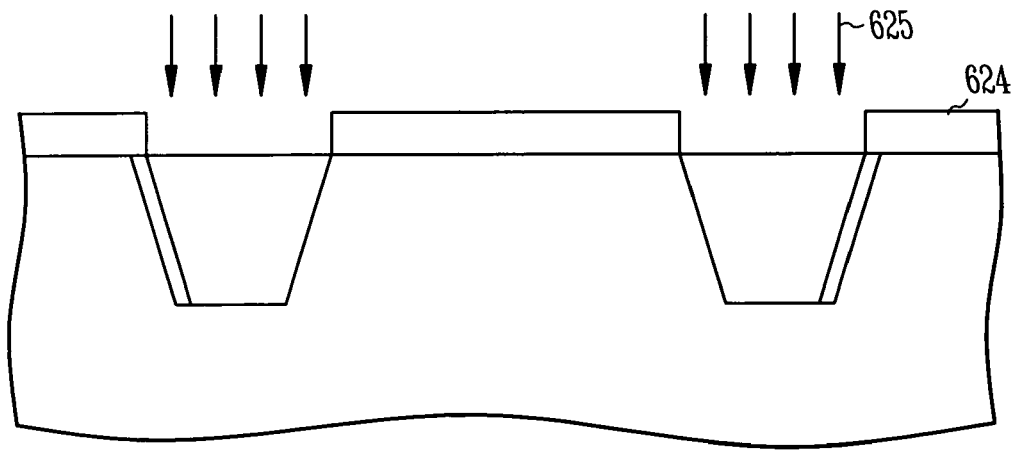
Figure 6F:
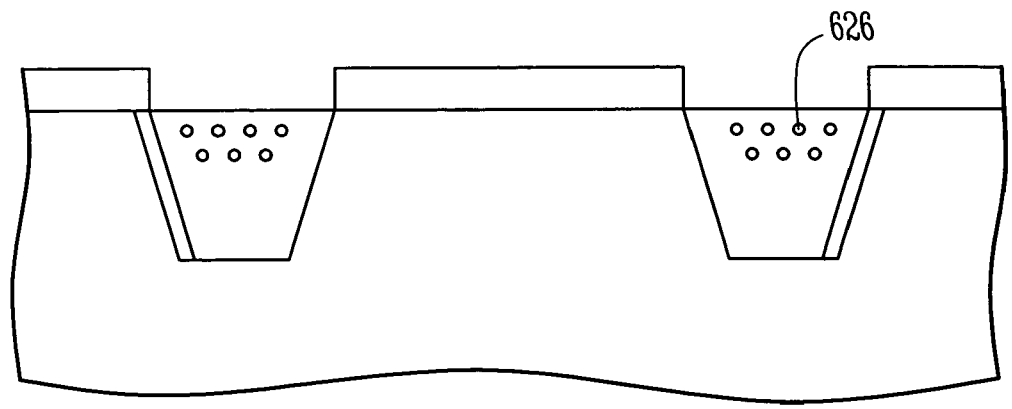

FIGS. 6A-6F illustrate a process to form nanocavities in stress-inducing regions of isolation regions, according to various embodiments. FIG. 6A illustrates a substrate 620, and trenched isolation regions 621. The illustrated substrate is a crystalline semiconductor, such as a crystalline silicon wafer. The trench can be etched using conventional techniques. As illustrated in FIG. 6B, a native oxide 622 (e.g. silicon oxide on a silicon wafer) forms after the trenches are formed due to air exposure. The oxide is selectively removed from the substrate surface. For example, the native oxide is left on one side of the trench. As will be described in more detail below, the other side of the trench will serve to seed a recrystallization process. However, recrystallization will not be initiated on surfaces with the native oxide. The oxide also restricts the expansion/contraction of the strain-inducing region at the interface of the strain-inducing region with the oxide. As illustrated in FIG. 6C, an amorphous semiconductor 623 is deposited to fill the trenches. Where the substrate is a crystalline silicon wafer, for example, an amorphous silicon can be deposited. The resulting structure is planarized, such as by a chemical mechanical polishing (CMP) process, to the level of the original substrate surface, as illustrated in FIG. 6D. As illustrated in FIG. 6E, a mask layer 624 is formed, and ions are implanted, as illustrated by arrows 625, into the strain-inducing region of the isolation trench. As illustrated in FIG. 6F, the structure is annealed, causing the implanted ions to transform into nanocavities 626 in the strain-inducing regions.

Figure 7A:
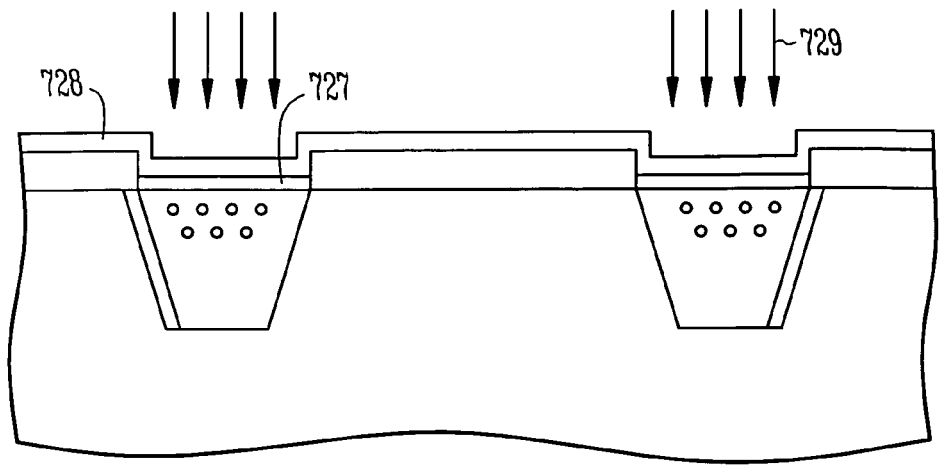
FIGS. 7A-7C illustrate a process to expand stress-inducing regions using the nanocavities formed in FIGS. 6A-6F, according to various embodiments.
Figure 7B:
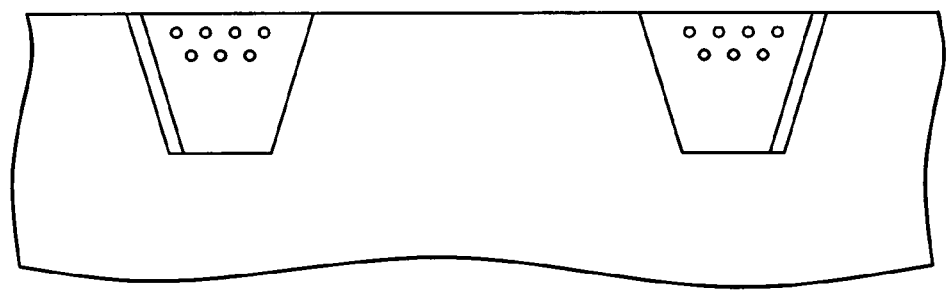
Figure 7C:
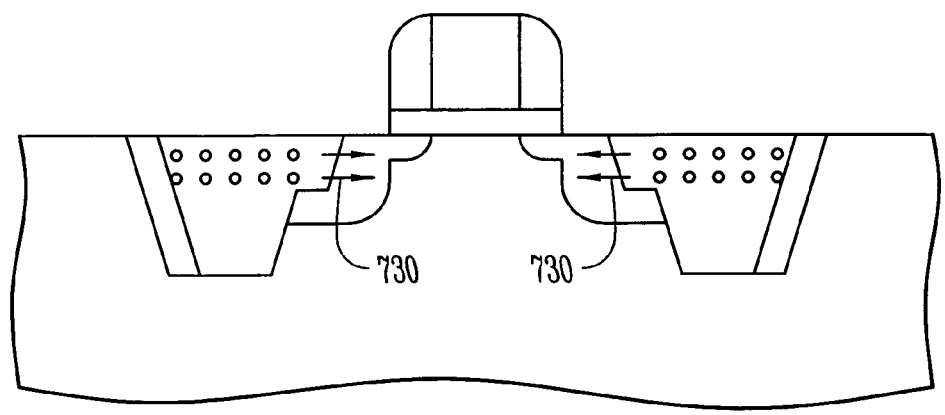

FIGS. 7A-7C illustrate a process to expand stress-inducing regions using the nanocavities formed in FIGS. 6A-6F, according to various embodiments. The isolation surface is sealed by depositing an oxide 727 and a nitride 728, and oxygen is implanted as illustrated by arrows 729. The mask, oxide, and nitride layers are removed as illustrated in FIG. 7B. The structure is annealed to cause oxide to form and expand the isolation region, as illustrated at 730 in FIG. 7C, and compress a channel region. A transistor device can be formed using the compressed channel region.

Figure 8A:
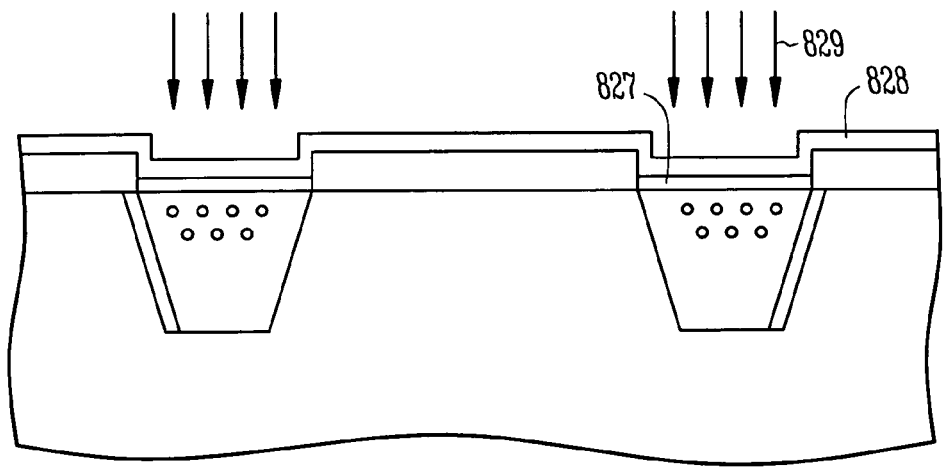
FIGS. 8A-8C illustrate a process to contract stress-inducing regions using the nanocavities formed in FIGS. 6A-6F, according to various embodiments.
Figure 8B:
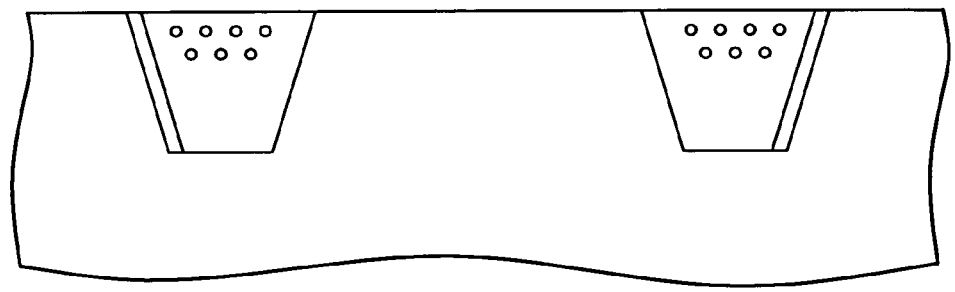
Figure 8C:
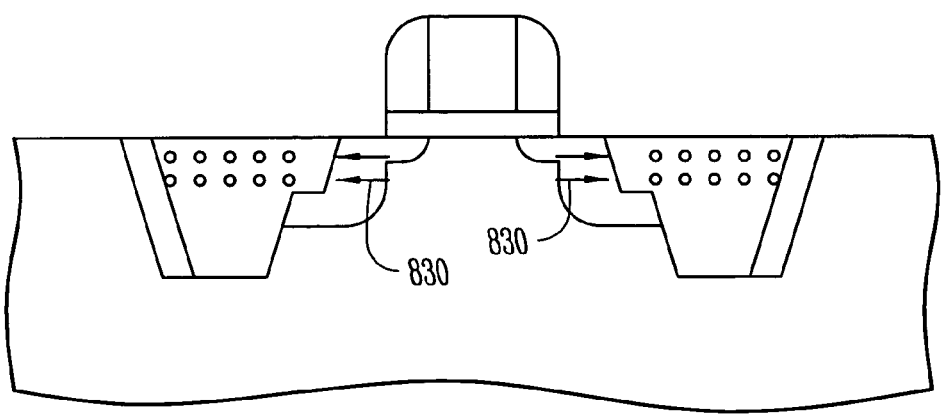

FIGS. 8A-8C illustrate a process to contract stress-inducing regions using the nanocavities formed in FIGS. 6A-6F, according to various embodiments. The isolation surface is sealed by depositing an oxide 827 and a nitride 828, and argon and hydrogen are implanted as illustrated by arrows 829. The mask, oxide, and nitride layers are removed as illustrated in FIG. 8B. The structure is annealed to cause the strain-inducing regions of the isolation regions to contract and tensile strain the channel region, as illustrated at 830 in FIG. 8C, and compress a channel region. A transistor device can be formed using the tensile strained channel region.

Figure 9A:
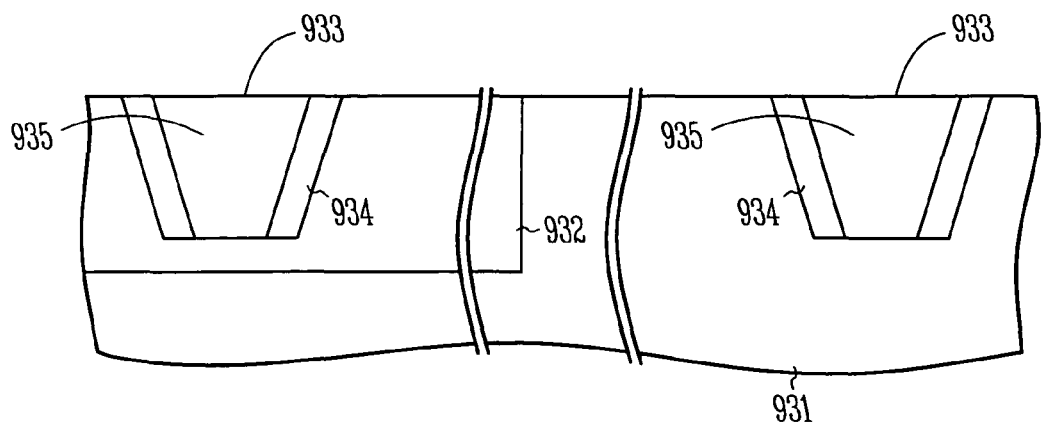
FIGS. 9A-9E illustrate an embodiment to compressively strain p-channel transistors and tensilely strain n-channel transistors, according to various embodiments.

FIGS. 9A-9E illustrate an embodiment to compressively strain p-channel transistors and tensilely strain n-channel transistors, according to various embodiments. The illustrated figure includes a p-doped substrate 931, and an n-well 932 within the substrate. Dashed lines indicate that substrate and n-well include other structures than that shown in the figures. FIG. 9A illustrates a trench 933 with an amorphous semiconductor (e.g. amorphous silicon) 934 on the sidewalls of the trench, and the trench filled with an oxide (e.g. silicon oxide) 935.

Figure 9B:
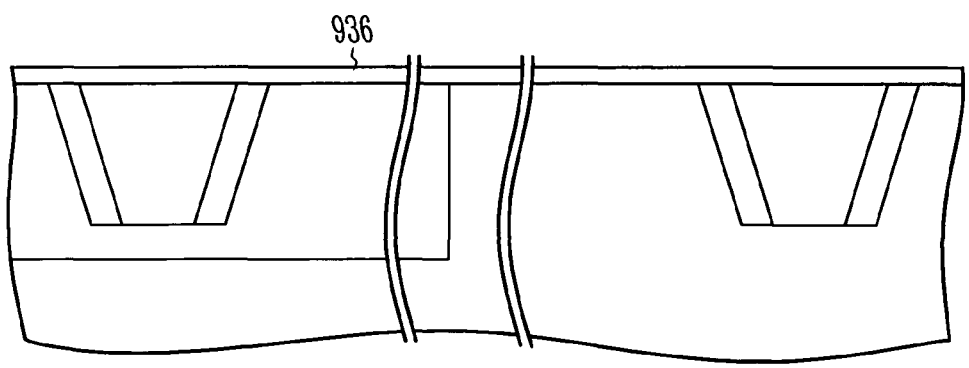
Figure 9C:
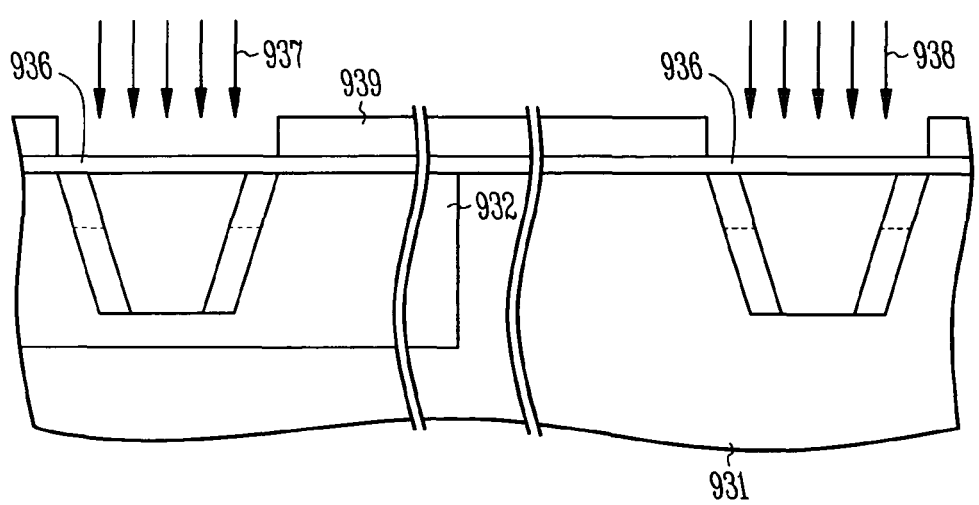
Figure 9D:
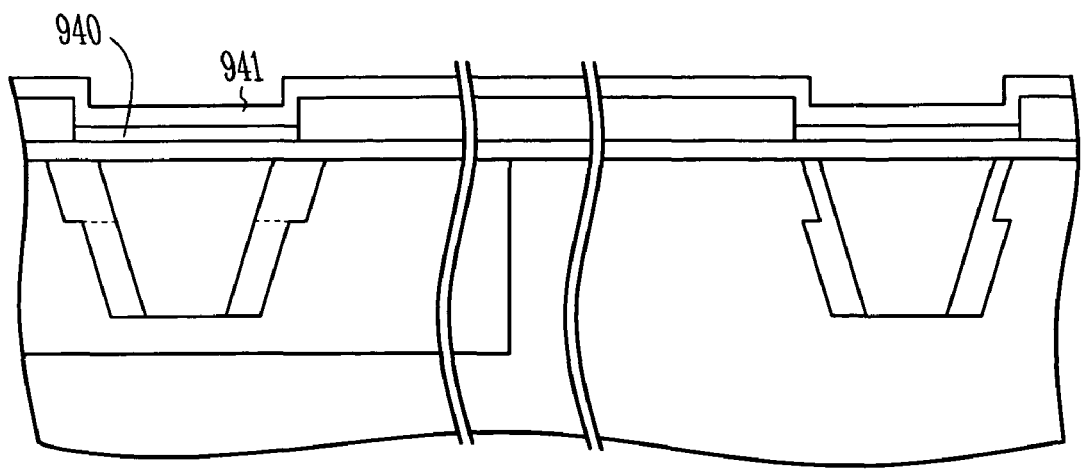
Figure 9E:
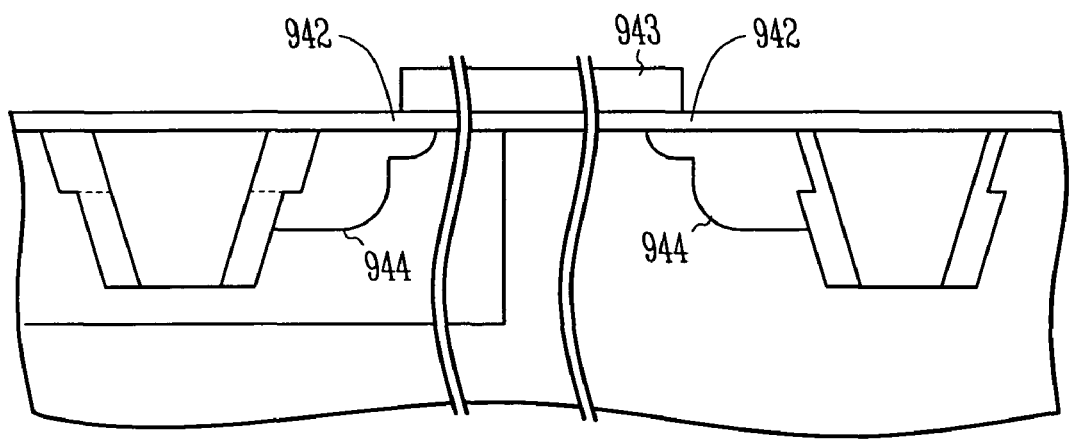

FIG. 9B illustrates a semiconductor layer 936 formed on the structure. For example, the layer can include an epitaxial layer of silicon with a thickness less than approximately 1000 Å. As illustrated in FIG. 9C, helium is implanted, as illustrated by arrows 937, into the isolation region in the n-well 932, and argon and hydrogen are implanted, as illustrated by arrows 938, in the isolation region in the p-type substrate. An appropriate mask layer 939 is used to assist with the implants. The amorphous silicon sidewalls expand where the helium was implanted, and contract due to recrystallization where the argon and hydrogen were implanted. An oxide 940 and nitride layer 941 are used to seal the surface, as illustrated in FIG. 9D. Devices, including a gate insulator 942, gate 943, and source/drain regions 944 are formed. The expanded or contracted sidewalls induce a desired strain for the channel regions of the device.

Figure 10A:
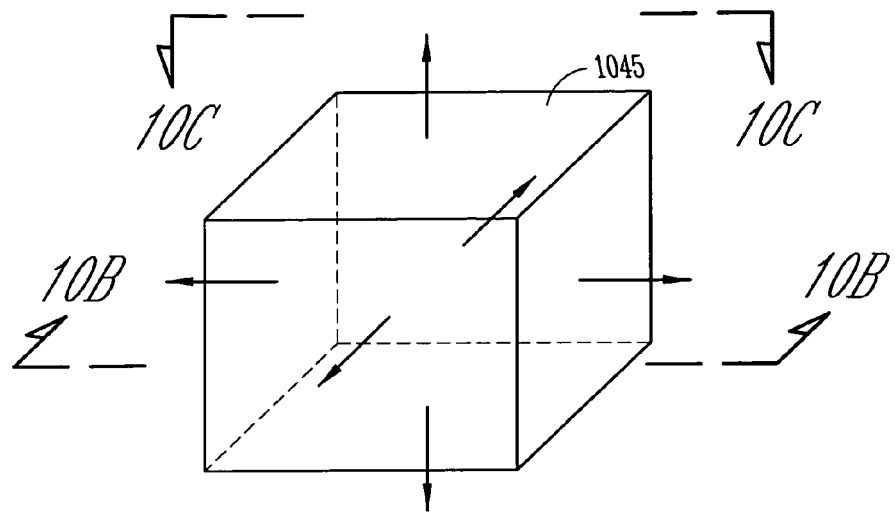
FIGS. 10A-10C illustrate an expanding stress-inducing region and corresponding stresses, including a compressive stress, in adjacent channel regions, according to various embodiments of the present subject matter.
Figure 10B:
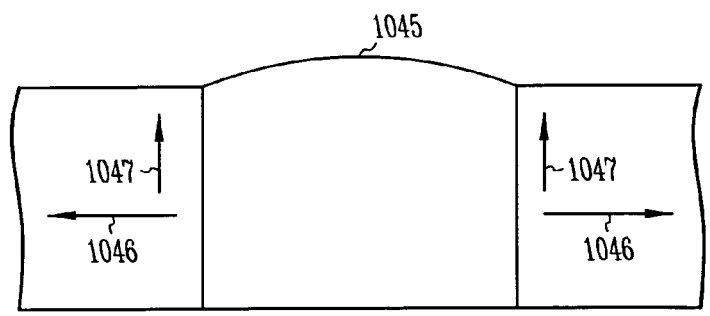
Figure 10C:
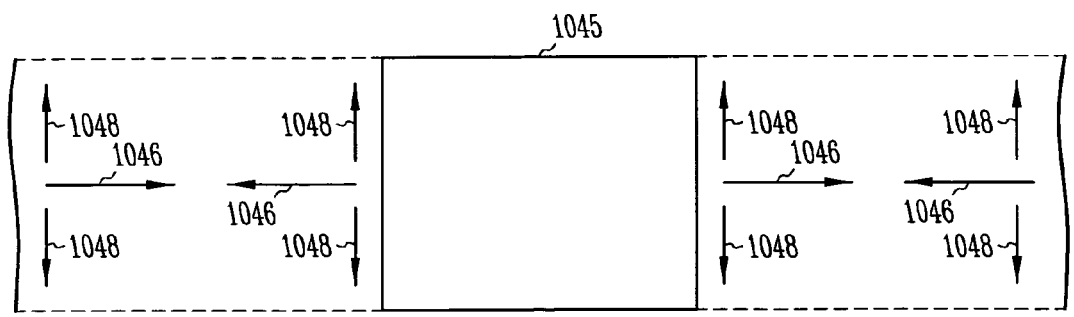

It has been illustrated how the adjusted volume of the strain-inducing regions can provide the desired compressive or tensile strain in the channel direction, referred to herein as the x-direction. There are also stresses applied in the direction into the paper (referred to herein as the y-direction) and the vertical direction (referred to herein as the z-direction). FIGS. 10A-10C illustrate forces associated with an expanding isolation region; and FIGS. 11A-11C illustrate forces associated with a contracting isolation region.

FIGS. 10A-10C illustrate an expanding stress-inducing region and corresponding stresses, including a compressive stress, in adjacent channel regions, according to various embodiments of the present subject matter. With respect to the expanding isolation regions 1045, the volume tends to grow in all directions (x, y and z), as illustrated in FIG. 10A. The corresponding compressive forces in the x-direction (the channel direction) are illustrated in FIGS. 10B and 10C by arrows 1046. However, as the volume expands, the volume pulls vertically on the surrounding crystalline regions, resulting in a vertically-oriented tensile strain, illustrated in FIG. 7B by arrows 1047. Additionally, the expanding volume pulls on the surrounding crystalline regions in the y-direction too, resulting in a corresponding tensile strain 1048 illustrated in FIG. 10C.

The tensile strain 1048 in the y-direction can be avoided by having the isolation regions constrained in the y-direction. In the z-direction, the edges of the implanted region are constrained by the un-implanted material. The implanted material wishes to move vertically and the un-implanted material does not. At the interface between the implanted and unimplanted material, the implanted material is under compression and the un-implanted material is in tension. With proper modeling, there can still be a large compressive strain in the direction of the transistor channel of a PMOS transistor.

Figure 11A:
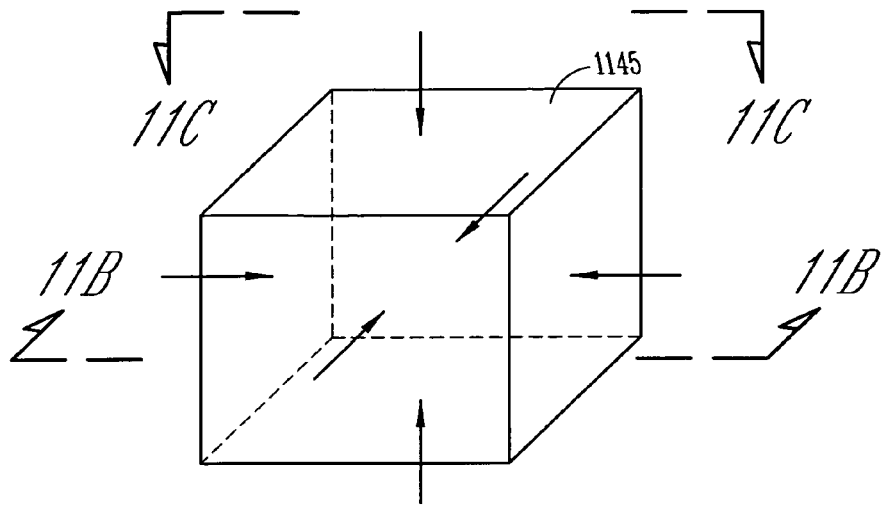
FIGS. 11A-11C illustrate a contracting stress-inducing region and corresponding stresses, including a tensile stress, in adjacent channel regions, according to various embodiments of the present subject matter.
Figure 11B:
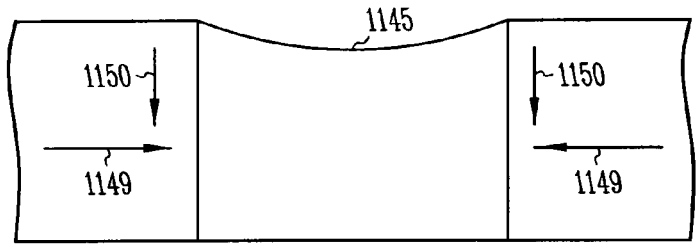
Figure 11C:
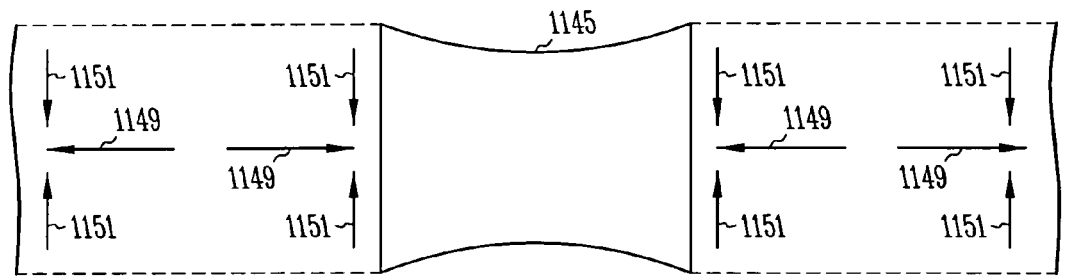

FIGS. 11A-11C illustrate a contracting stress-inducing region and corresponding stresses, including a tensile stress, in adjacent channel regions, according to various embodiments of the present subject matter. With respect to the contracting isolation regions 1145, the volume tends to contract in all directions (x, y and z), as illustrated in FIG. 11A. The corresponding tensile forces in the x-direction (the channel direction) are illustrated in FIGS. 11B and 11C by arrows 1149. However, as the volume contracts, the volume pulls vertically on the surrounding crystalline regions, resulting in a vertically-oriented compressive strain, illustrated in FIG. 11B by arrows 1150. Additionally, the contracting volume pulls on the surrounding crystalline regions in the y-direction too, resulting in a corresponding compressive strain 1151 illustrated in FIG. 11C.

Figure 12:
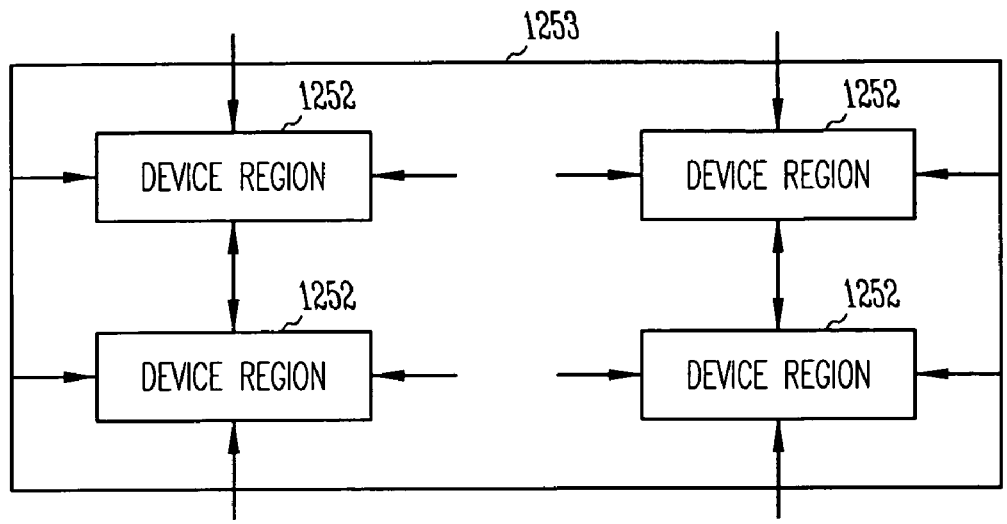
FIG. 12 illustrates a top view of device channel regions under compressive stress due to expanded isolation regions.

FIG. 12 illustrates a top view of device channel regions under compressive stress due to expanded isolation regions. Device regions 1252, including device channel regions, are illustrated in a substrate. Isolation regions 1253 define the device regions 1252. As illustrated in FIG. 12, as the isolation regions expand, the device regions are compressively strained. The expanding strain-inducing regions within the isolation regions can be defined to provide uniaxial compressive strain or biaxial compressive strain.

Figure 13:
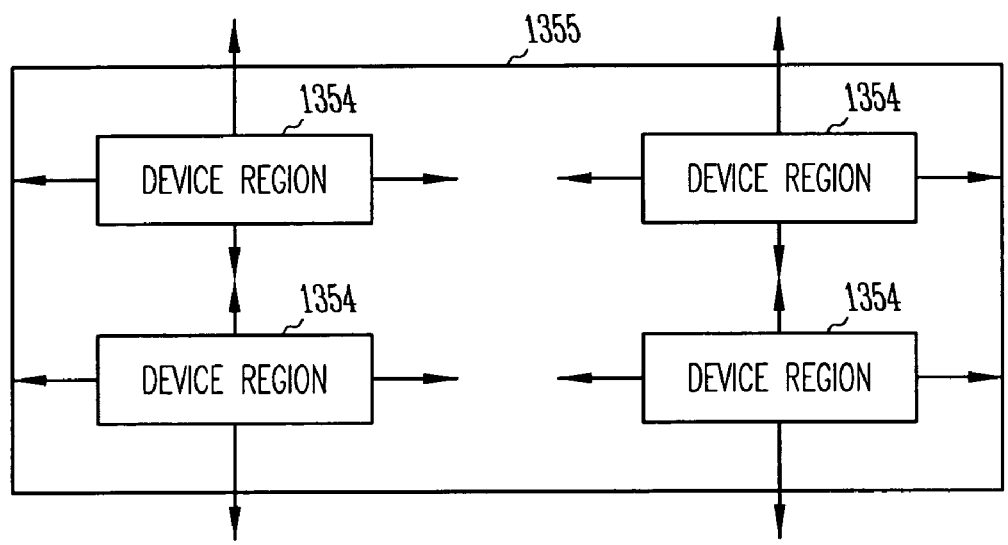
FIG. 13 illustrates a top view of device channel regions under tensile stress due to contracted isolation regions.

FIG. 13 illustrates a top view of device channel regions under tensile stress due to contracted isolation regions. Device regions 1354, including device channel regions, are illustrated in a substrate. Isolation regions 1355 define the device regions 1354. As illustrated in FIG. 13, as the isolation regions contract, due to recrystallization of an amorphous semiconductor for example, the device regions have a tensile strain. The contracting isolation regions can be defined to provide uniaxial tensile strain or biaxial tensile strain.

The isolation regions can be appropriately defined to provide a desired strain when the volume of the isolation regions are adjusted. Thus, for example, various embodiments adjust the volumes of isolation regions on a first side and on an opposing second side of the device region to provide a predominantly uniaxial strain. Various embodiments adjust volumes of isolation regions surrounding the device region to provide a predominantly biaxial strain.

Figure 14:
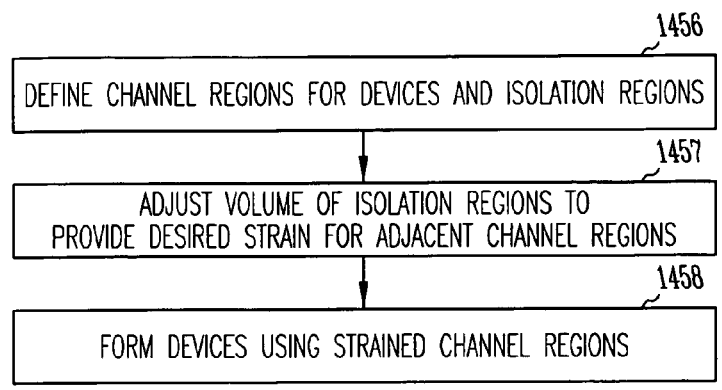
FIG. 14 illustrates a method for forming a device with a strained channel, according to various embodiments of the present subject matter.

FIG. 14 illustrates a method for forming a device with a strained channel, according to various embodiments of the present subject matter. At 1456, device channel regions and isolation regions are defined. The volume of the strain-inducing regions of the isolation regions are adjusted at 1457. The adjusted volume induces a desired strain in the adjacent device channel regions. A compressive strain to improve hole mobility for a PMOS transistor can be induced by expanding the adjacent isolation regions. A tensile strain to improve electron mobility for an NMOS transistor can be induced by contracting the adjacent isolation regions. At 1458, devices are formed using the strained channel regions. P-channel devices, such as a PMOS transistor, are formed using the compressive strained channel regions, and N-channel devices, such as a NMOS transistor, are formed using the tensile strained channel regions.

Figure 15:
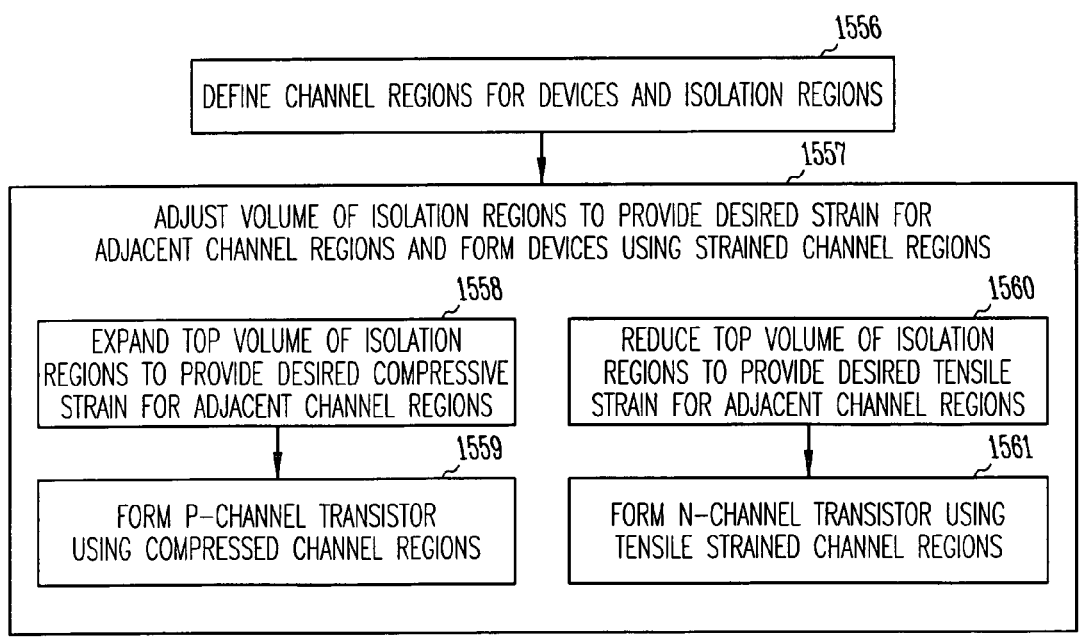
FIG. 15 illustrates a method for forming p-channel and n-channel devices with appropriately strained channels, according to various embodiments of the present subject matter.

FIG. 15 illustrates a method for forming p-channel and n-channel devices with appropriately strained channels, according to various embodiments of the present subject matter. Those of ordinary skill in the art, upon reading and comprehending this disclosure, will understand that the disclosed methods for straining semiconductor can be used in CMOS technology. Appropriate masking of isolation regions adjacent to NMOS devices and isolation regions adjacent to PMOS devices can be used to selectively expand the isolation regions adjacent to the PMOS channels to compressively strain the PMOS channels and improve hole mobility, and to selectively contract the isolation regions adjacent to the NMOS channels to tensile strain the NMOS channels and improve electron mobility. At 1556, device channel regions and isolation regions are defined, and devices are formed using the strained channel regions. At 1557, the volume of isolation regions is adjusted to provide the desired strain for adjacent channel regions. Devices are formed using the strained channel regions. For p-channel transistors, the top volume, also referred to as the strain-inducing region, of isolation regions are expanded at 1558 to provide the desired compressive strain for adjacent p-channel regions. For n-channel transistors, the top volume, also referred to as the strain-inducing region, of the isolation regions are contracted at 1560 to provide the desired tensile strain for adjacent n-channel regions. P-channel transistors are formed using the compressed channel regions at 1559, and n-channel transistors are formed using the tensile strained channel regions at 1561.

According to various embodiments, the process to provide a desired compressive strain for a p-channel device includes engineering the process to induce a compressive strain within a range of approximately 0.2% and 1.0%. According to various embodiments, the process to provide a desired tensile strain for an n-channel device includes engineering the process to induce a tensile strain greater than approximately 0.5%. For example, various embodiments provide a tensile strain within a range of approximately 0.75% to approximately 1.5%. It is also desirable to reduce unnecessary strain and provide a margin for error without unduly affecting the mobility enhancement. Thus, it is desirable to provide a tensile strain in the range of approximately 1% to approximately 1.2%.

Figure 16:
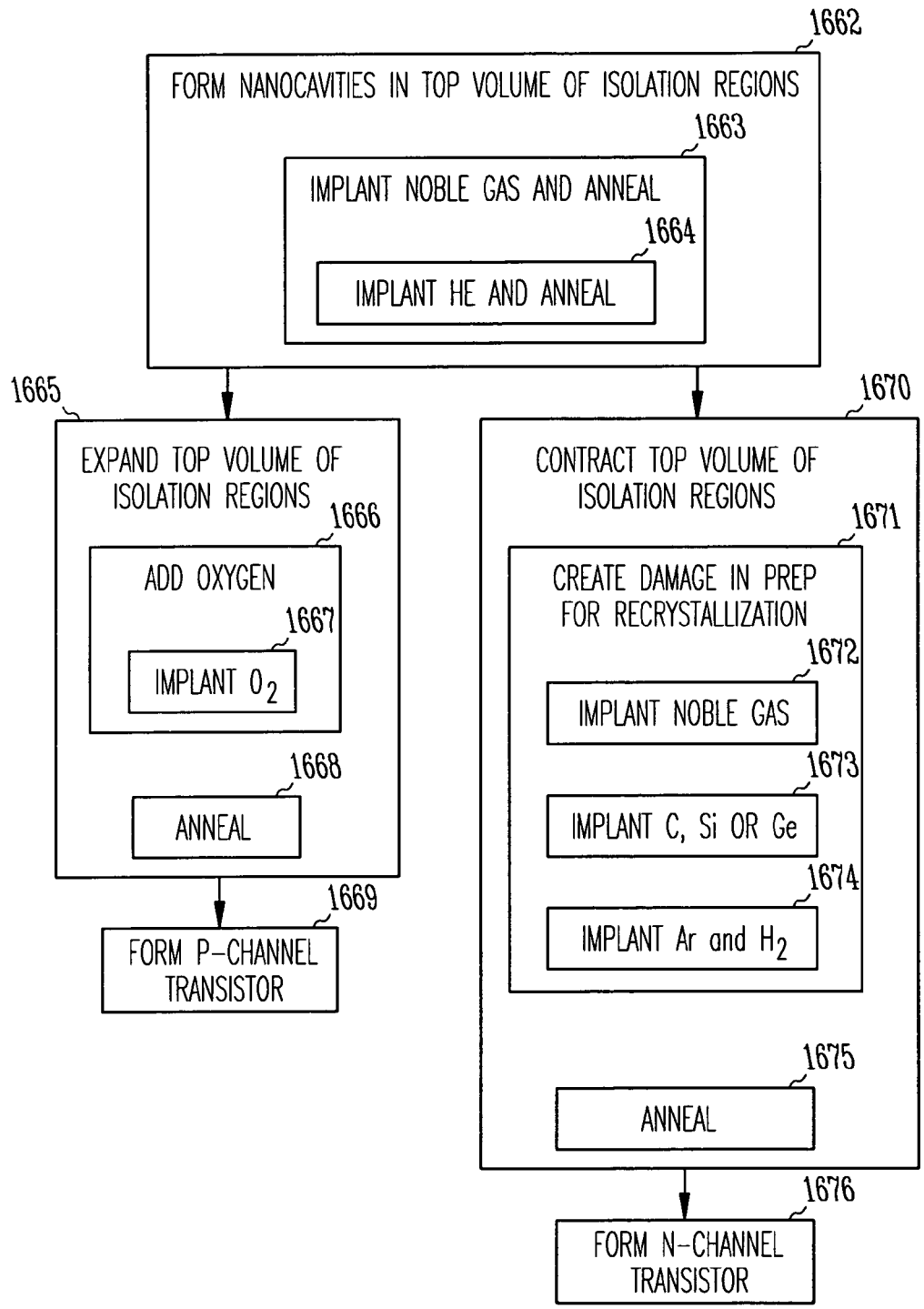
FIG. 16 illustrates embodiments for forming p-channel and n-channel transistors with strained channels.

FIG. 16 illustrates embodiments for forming p-channel and n-channel transistors with strained channels. At 1662, nanocavities are formed in the top volume, also referred to as strain-inducing regions, of isolation regions. According to various embodiments, forming the nanocavities includes implanting a noble gas and annealing as illustrated at 1663. According to various embodiments, helium is implanted as illustrated at 1664.

The top volume of isolation regions is expanded at 1665. According to various embodiments, expanding the top volume includes adding oxygen as illustrated at 1666, which can include implanting oxygen ions as illustrated at 1667. Expanding the top volume also includes annealing as illustrated at 1668. A p-channel transistor is formed at 1669.

The top volume of isolation regions are contracted at 1670. According to various embodiments, contracting the top volume includes creating damage in preparation to recrystallize the region, as illustrated at 1671. Various embodiments create damage using a noble gas implant 1672, a carbon, silicon or germanium implant 1673, or an argon and hydrogen implant 1674. Contracting the top volume also includes annealing as illustrated at 1675. Annealing 1675 can be the same process as 1668. N-channel transistors are formed at 1676.

Figure 17:
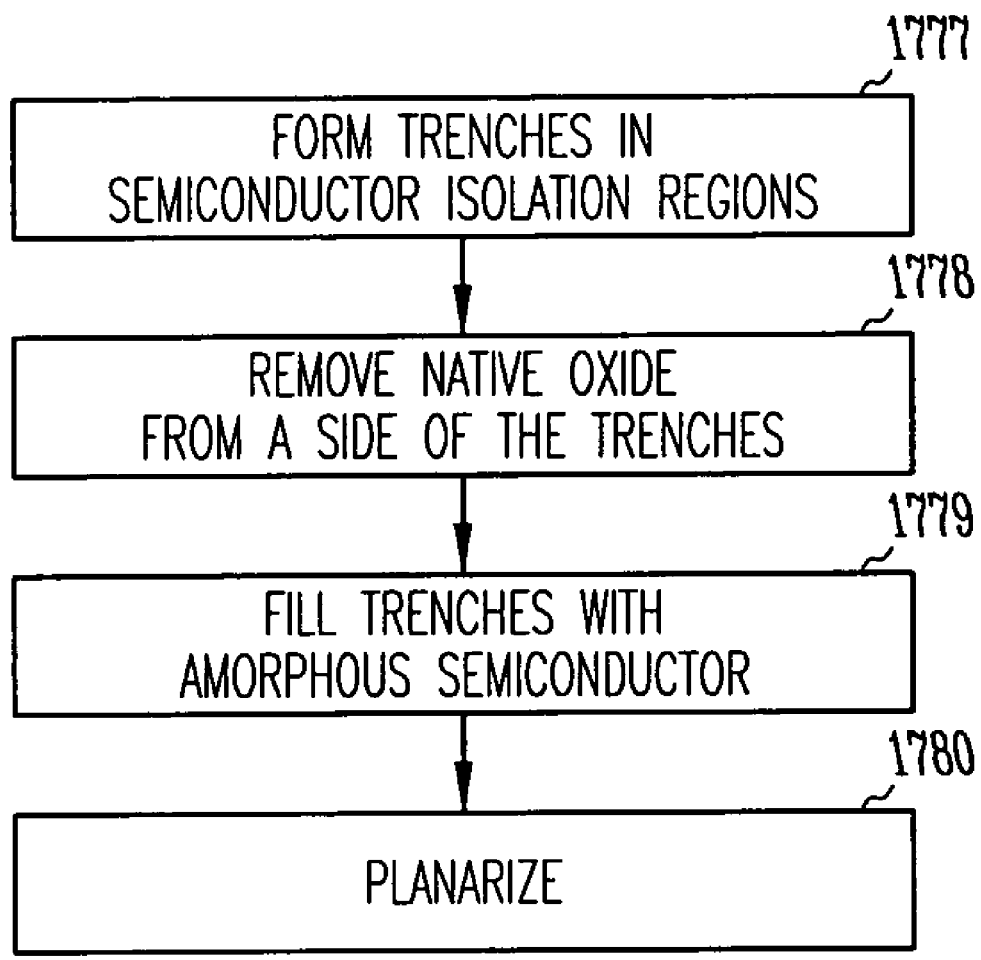
FIG. 17 illustrates an embodiment for forming isolation regions between device regions.

FIG. 17 illustrates an embodiment for forming isolation regions between device regions, such as illustrated in FIGS. 6A-6D. At 1777, trenches are formed in semiconductor isolation regions. A native oxide is removed from a side of the trenches 1778. At 1779, trenches are filled with amorphous semiconductor, and the structure is planarized at 1780.

Figure 18:
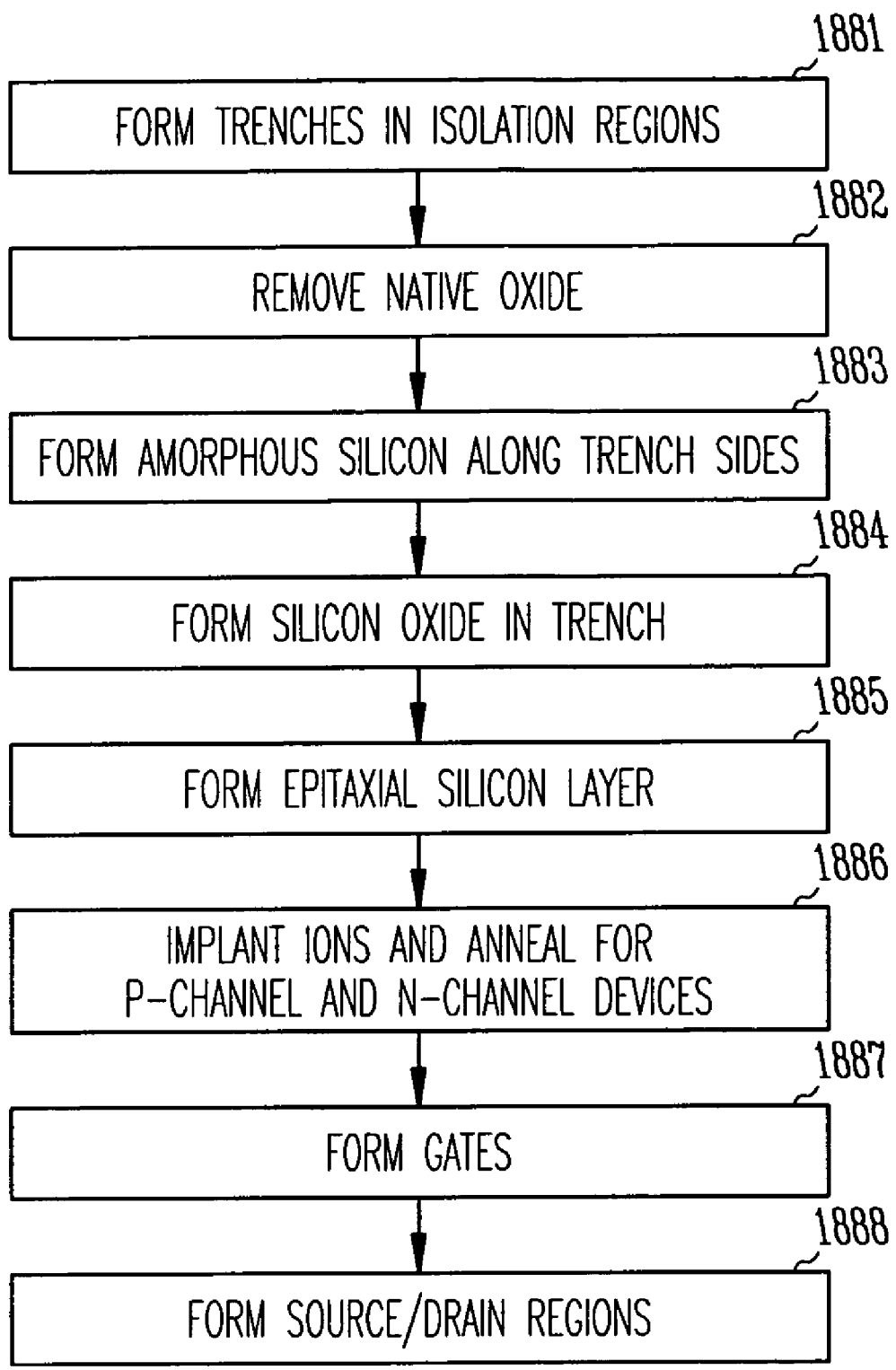
FIG. 18 illustrates an embodiment for forming p-channel and n-channel devices with strained channels.

FIG. 18 illustrates an embodiment for forming p-channel and n-channel devices with strained channels. At 1881, trenches are formed in isolation regions. Native oxide is removed at 1882. An amorphous silicon is formed along trench sides at 1883, and a silicon oxide is formed in the trench at 1884. An epitaxial silicon layer is formed at 1885. As illustrated at 1886, appropriate ion implants are performed for p-channel and n-channel devices, and an anneal is performed. Gates are formed at 1887, and source/drain regions are formed at 1888.

Figure 19:
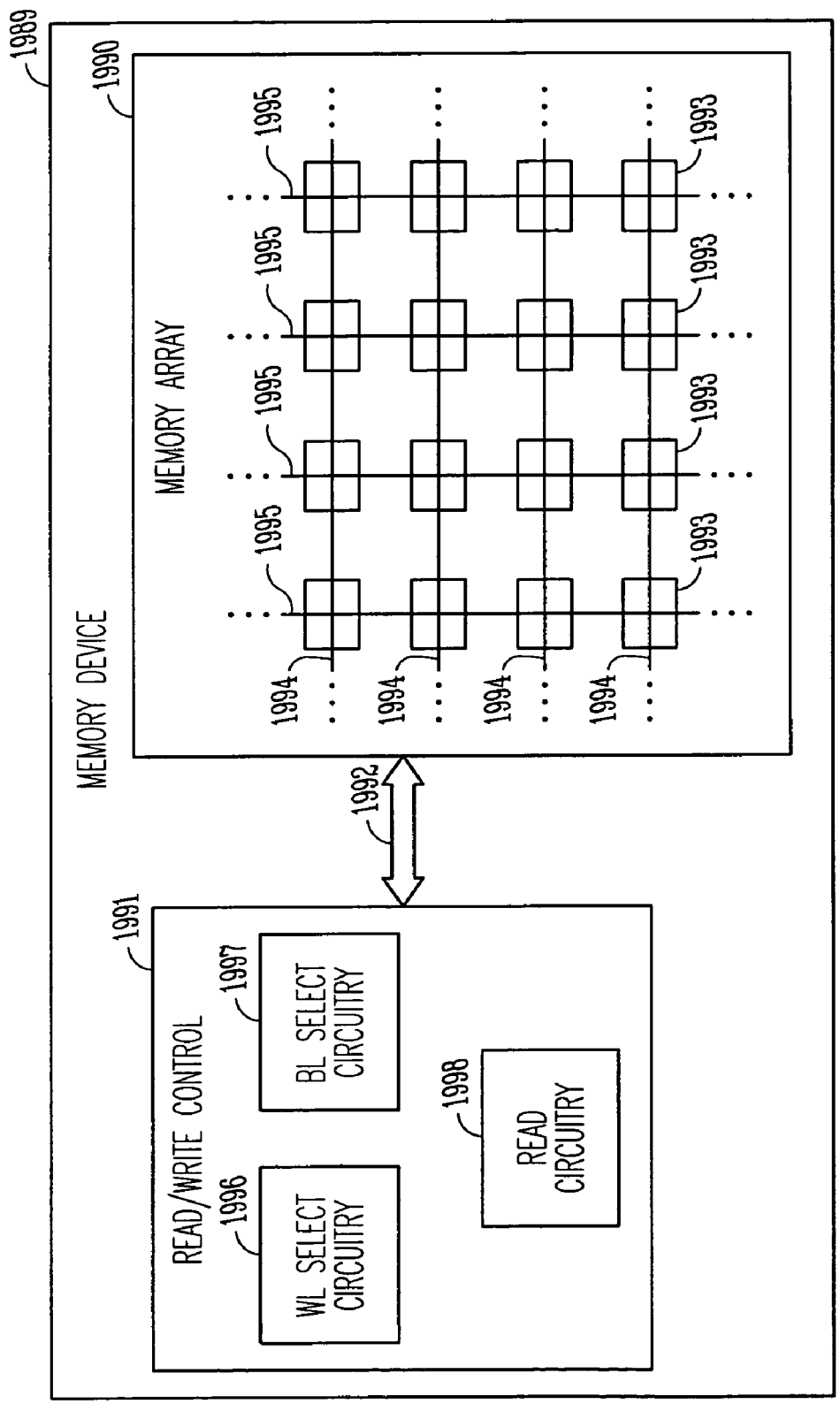
FIG. 19 is a simplified block diagram of a high-level organization of various embodiments of a memory device according to various embodiments of the present subject matter.

FIG. 19 is a simplified block diagram of a high-level organization of various embodiments of a memory device according to various embodiments of the present subject matter. The illustrated memory device 1989 includes a memory array 1990 and read/write control circuitry 1991 to perform operations on the memory array via communication line(s) or channel(s) 1992. The illustrated memory device 1989 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using the strained semiconductor, as described above. For example, in various embodiments, the memory array and/or the control circuitry include p-channel transistors with compressively-strained channels for improved hole mobility and/or n-channel transistors with tensile-strained channels for improved electron mobility. The structure and fabrication methods for these devices have been described above.

The illustrated memory array 1990 includes a number of memory cells 1993 arranged in rows and columns, where word lines 1994 connect the memory cells in the rows and bit lines 1995 connect the memory cells in the columns. The read/write control circuitry 1991 includes word line select circuitry 1996, which functions to select a desired row. The read/write control circuitry 1991 further includes bit line select circuitry 1997, which functions to select a desired column. The read/write control circuitry 1991 further includes read circuitry 1998, which functions to detect a memory state for a selected memory cell in the memory array 1990.

Figure 20:
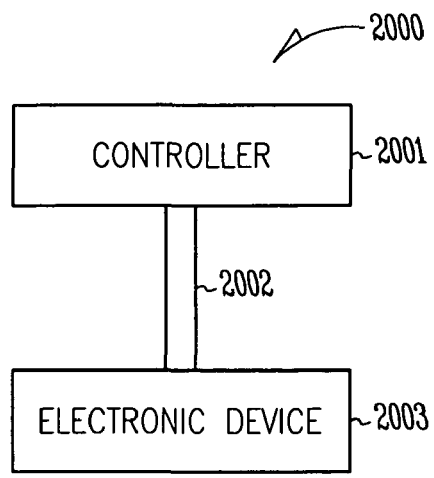
FIG. 20 illustrates a diagram for an electronic system having one or more transistors with strained channels for improved mobility, according to various embodiments of the present subject matter.

FIG. 20 illustrates a diagram for an electronic system having one or more transistors with strained channels for improved mobility, according to various embodiments of the present subject matter. Electronic system 2000 includes a controller 2001, a bus 2002, and an electronic device 2003, where the bus 2002 provides communication channels between the controller 2001 and the electronic device 2003. In various embodiments, the controller and/or electronic device include p-channel transistors with compressively-strained channels and/or n-channel transistors with tensile-strained channels as previously discussed herein. The illustrated electronic system 2000 may include, but is not limited to, information handling devices, wireless systems, telecommunication systems, fiber optic systems, electro-optic systems, and computers.

Figure 21:
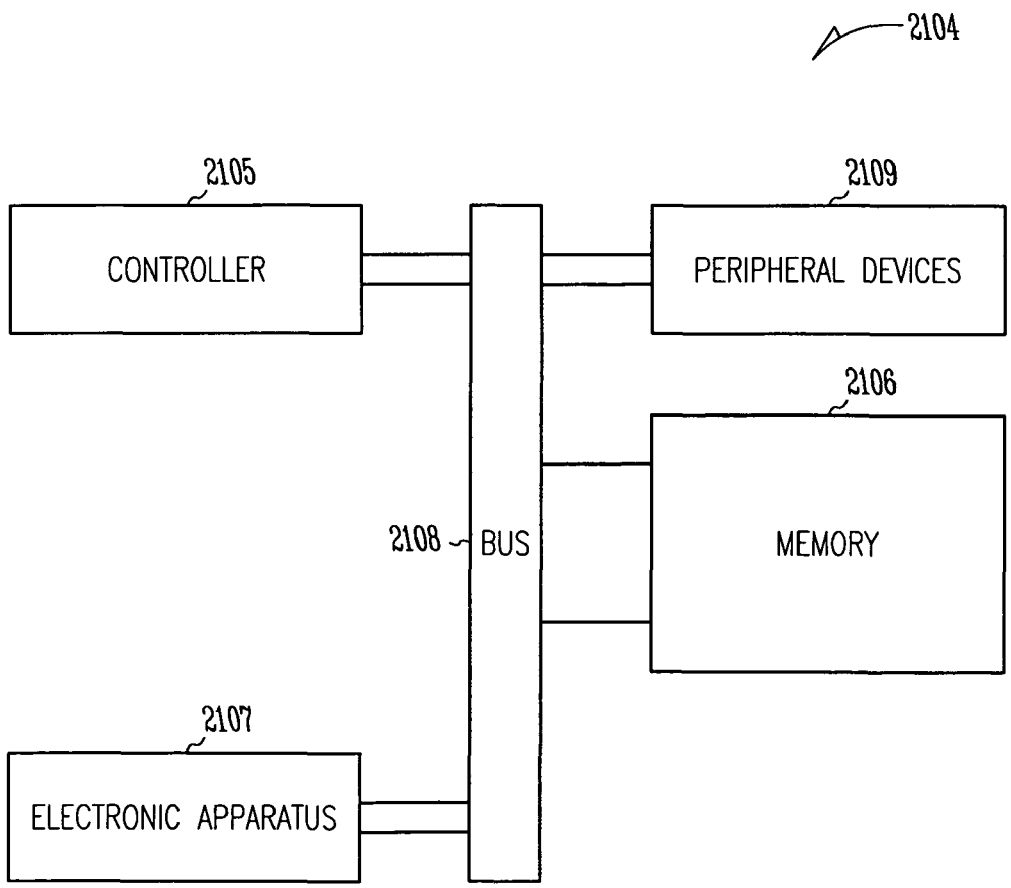
FIG. 21 illustrates an embodiment of a system having a controller and a memory, according to various embodiments of the present subject matter.

FIG. 21 illustrates an embodiment of a system 2104 having a controller 2105 and a memory 2106, according to various embodiments of the present subject matter. The controller 2105 and/or memory 2106 may include p-channel transistors with compressively-strained channels and/or n-channel transistors with tensile-strained channels fabricated according to various embodiments. The illustrated system 2104 also includes an electronic apparatus 2107 and a bus 2108 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 2107 may be additional memory configured similar to memory 2106. An embodiment may include a peripheral device or devices 2109 coupled to the bus 2108. Peripheral devices may include displays, additional storage memory, or other control devices that may operate in conjunction with the controller and/or the memory. In an embodiment, the controller is a processor. Any of the controller, the memory, the electronic apparatus, and the peripheral devices may include p-channel transistors with compressively-strained channels and/or n-channel transistors with tensile-strained channels formed according to various embodiments. The system may include, but is not limited to, information handling devices, telecommunication systems, and computers. Applications containing strained semiconductor films, such as p-channel transistors with compressively-strained channels, as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as cameras, video recorders and players, televisions, displays, games, phones, clocks, personal computers, wireless devices, automobiles, aircrafts, industrial control systems, and others.

The memory may be realized as a memory device containing p-channel transistors with compressively-strained channels formed according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM).

This disclosure includes several processes, circuit diagrams, and semiconductor structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method, comprising:
defining a device region in a semiconductor substrate and isolation regions adjacent to the device region, the device region having a channel region and the isolation regions having strain-inducing regions laterally adjacent to the channel region, wherein each isolation region includes a trench filled with an amorphous semiconductor and each trench filled with the amorphous semiconductor has a top volume of the amorphous semiconductor extending across the trench, wherein the top volumes are adjacent to the device region and are the strain-inducing regions laterally adjacent to the channel regions; and
straining the channel region with a desired strain for carrier mobility enhancement, wherein straining the channel region includes adjusting the top volumes of the trenches filled with the amorphous semiconductor to provide the desired strain, and adjusting the top volumes includes implanting at least one ion type into the amorphous semiconductor with an energy resulting in a peak implant in the top volumes of the trenches filled with the amorphous semiconductor.

2. The method of claim 1, wherein implanting at least one ion type includes implanting a noble element.

3. The method of claim 2, wherein implanting a noble element includes implanting helium.

4. The method of claim 3, further comprising annealing to form nanocavities in the strain-inducing regions, and then implanting oxygen and annealing to form oxide in the strain-inducing regions.

5. The method of claim 3, further comprising annealing to form nanocavities in the strain-inducing regions, and then implanting argon and annealing to recrystallize the strain-inducing regions.

6. The method of claim 5, further comprising implanting hydrogen.

7. The method of claim 2, wherein implanting a noble element includes implanting argon.

8. The method of claim 1, further comprising depositing a semiconductor layer on the semiconductor substrate before implanting at least one ion type in the strain-inducing regions.

9. The method of claim 8, wherein implanting at least one ion type includes implanting helium ions and annealing to form nanocavities in the strain-inducing regions to expand the strain-inducing regions and compressively strain the channel region.

10. The method of claim 8, wherein implanting at least one ion type includes implanting argon ions and annealing to recrystallize regions to recrystallize the strain-inducing regions to contract the strain-inducing regions and tensilely strain the channel region.

11. The method of claim 1, further comprising forming a device, the device including the strained channel region.

12. The method of claim 1, wherein the desired strain in the channel region includes a predominant uniaxial strain in a channel direction.

13. The method of claim 1, wherein the desired strain in the channel region includes a predominant biaxial strain.

14. The method of claim 1, wherein the semiconductor substrate includes a silicon substrate.

15. The method of claim 1, wherein the semiconductor substrate includes a compound semiconductor.

16. The method of claim 15, wherein the compound semiconductor includes GaAs.

17. The method of claim 15, wherein the compound semiconductor includes InP.

18. The method of claim 1, wherein the desired strain includes a compressive strain within a range of approximately 0.2% to approximately 1.0%.

19. The method of claim 1, wherein the desired strain includes a tensile strain greater than approximately 0.5%.

20. The method of claim 1, wherein the desired strain includes a tensile strain within a range of approximately 0.75% to approximately 1.5%.

21. The method of claim 1, wherein the strain-inducing regions have a depth of about 200 Å or less from a top surface of the isolation regions; and straining the channel region with a desired strain for carrier mobility enhancement includes implanting the at least one ion type at an energy to provide a peak implant in the strain-inducing regions.

22. The method of claim 1, wherein the strain-inducing regions have a depth of about 100 Å or less from a top surface of the isolation regions; and straining the channel region with a desired strain for carrier mobility enhancement includes implanting the at least one ion type at an energy to provide a peak implant in the strain-inducing regions.

23. A method, comprising:
defining a device region in a semiconductor substrate and isolation regions adjacent to the device region, the device region having a channel region and the isolation regions having strain-inducing regions laterally adjacent to the channel region, wherein each isolation region includes a trench filled with an amorphous semiconductor and each trench filled with the amorphous semiconductor has a top volume of the amorphous semiconductor extending across the trench, wherein the top volumes are adjacent to the device region and are the strain-inducing regions laterally adjacent to the channel regions; and
straining the channel region with a desired strain for carrier mobility enhancement, wherein straining the channel region includes adjusting the top volumes of the trenches filled with the amorphous semiconductor to provide the desired strain, and adjusting the top volumes includes implanting at least one ion type into the amorphous semiconductor to form a peak density of nanocavities in the top volumes of the trenches filled with the amorphous semiconductor.

24. The method of claim 23, wherein implanting at least one ion type into the amorphous semiconductor to form nanocavities includes implanting the at least one ion type in the strain-inducing regions and annealing.

25. The method of claim 24, wherein implanting the at least one ion type includes implanting a noble element.

26. The method of claim 25, wherein implanting a noble element includes implanting helium.

27. The method of claim 23, wherein straining the channel region includes compressively straining the channel region.

28. The method of claim 27, wherein compressively straining the channel region includes adding oxygen to the strain-inducing regions and annealing to form an oxide and expand the strain-inducing regions.

29. The method of claim 28, wherein adding oxygen includes implanting oxygen ions in the strain-inducing regions.

30. The method of claim 23, wherein straining the channel region includes tensilely straining the channel region.

31. The method of claim 30, wherein tensilely straining the channel region includes recrystallizing the strain-inducing regions.

32. The method of claim 31, wherein recrystallizing the strain-inducing regions includes implanting ions in the strain-inducing regions and annealing.

33. The method of claim 32, wherein implanting ions includes implanting a noble element.

34. The method of claim 33, wherein implanting a noble element includes implanting argon.

35. The method of claim 32, wherein implanting ions includes implanting hydrogen.

36. The method of claim 32, wherein implanting ions includes implanting hydrogen and argon.

37. The method of claim 23, further comprising forming a device, the device including the strained channel region.

38. A method, comprising:
defining a device region in a semiconductor substrate and isolation regions adjacent to the device region, the device region having a channel region and the isolation regions having strain-inducing regions laterally adjacent to the channel regions, wherein each isolation region includes a trench filled with an amorphous semiconductor and each trench filled with the amorphous semiconductor has a top volume of the amorphous semiconductor extending across the trench, wherein the top volumes are adjacent to the device region and are the strain-inducing regions laterally adjacent to the channel regions; and straining the channel region with a desired tensile strain for electron mobility enhancement, wherein straining the channel region includes adjusting the top volumes of the trenches filled with the amorphous semiconductor to provide the desired strain, and adjusting the top volumes includes:
  implanting helium into the amorphous semiconductor in the top volumes;
  annealing to form a peak density of nanocavities in the top volumes;
  implanting argon and hydrogen into the amorphous semiconductor in the top volumes; and
  annealing to recrystallize the top volumes and tensilely strain the channel region.

39. The method of claim 38, wherein implanting helium includes implanting helium at a dose greater than $3 \times 10^{20}/cm^3$.

40. The method of claim 38, wherein the strain-inducing regions have a depth of about 200 Å from a top surface of the isolation regions; and implanting helium includes implanting helium with an energy to confine a majority of helium ions to the strain-inducing regions.

41. The method of claim 38, wherein implanting argon and hydrogen includes implanting argon at a dose greater than $3 \times 10^{20}/cm^3$ and implanting hydrogen at a dose greater than $3 \times 10^{20}/cm^3$.

42. The method of claim 38, wherein the strain-inducing regions have a depth of about 200 Å from a top surface of the isolation regions, and implanting argon and hydrogen includes implanting argon and hydrogen to confine a majority of argon ions and hydrogen ions to the strain-inducing regions.

43. The method of claim 38, further comprising forming a device, the device including the strained channel region.

44. A method, comprising:
  defining a device region in a semiconductor substrate and isolation regions adjacent to the device region, the device region having a channel region and the isolation regions having strain-inducing regions laterally adjacent to the channel region, wherein each isolation region includes a trench filled with an amorphous semiconductor and each trench filled with the amorphous semiconductor has a top volume of the amorphous semiconductor extending across the trench, wherein the top volumes are adjacent to the device region and are the strain-inducing regions laterally adjacent to the channel regions; and
  straining the channel region with a desired compressive strain for hole mobility enhancement, including:
    implanting helium in the top volumes of the trenches filled with the amorphous semiconductor;
    annealing to form a peak density of nanocavities in the top volumes of the trenches filled with the amorphous semiconductor;
    implanting oxygen in the top volumes of the trenches filled with the amorphous semiconductor; and
    annealing to form an oxide in the top volumes of the trenches filled with the amorphous semiconductor and compressively strain the channel region.

45. The method of claim 44, wherein the oxide includes a silicon oxide.

46. The method of claim 44, wherein implanting helium includes implanting helium at a dose greater than $3 \times 10^{20}/cm^3$.

47. The method of claim 44, wherein the strain-inducing regions have a depth of about 200 Å from a top surface of the isolation regions; and implanting helium includes implanting helium with an energy to confine a majority of helium ions to the strain-inducing regions.

48. The method of claim 44, further comprising forming a device, the device including the strained channel region.

49. A method, comprising:
  defining a device region in a semiconductor substrate and isolation regions adjacent to the device region, the device region having a channel region and the isolation regions having strain-inducing regions laterally adjacent to the channel regions, wherein each isolation region includes a trench filled with an amorphous semiconductor and each isolation region has a top volume of the amorphous semiconductor extending across the trench, wherein the top volumes are adjacent to the device region and are the strain-inducing regions laterally adjacent to the channel regions;
  forming a semiconductor layer on the semiconductor substrate; and
  straining the channel region with a desired tensile strain for electron mobility enhancement, wherein straining the channel region includes adjusting the top volumes of the trenches filled with the amorphous semiconductor to provide the desired strain, and adjusting the top volumes includes:
    implanting argon and hydrogen through the semiconductor layer into the amorphous semiconductor to form a peak implant in the top volumes of the trenches filled with the amorphous semiconductor; and
    annealing to recrystallize the top volumes and tensilely strain the channel region.

50. The method of claim 49, wherein forming a semiconductor layer on the semiconductor substrate includes depositing an epitaxial semiconductor layer less than 1000 Å thick.

51. The method of claim 49, wherein implanting argon and hydrogen include implanting both argon and implanting hydrogen with an energy to confine a implant peak of argon ions and hydrogen ions to the semiconductor substrate within 100 Å from an interface between the substrate and the semiconductor layer.

52. The method of claim 49, further comprising forming a device, the device including the strained channel region.

53. A method, comprising:
  defining a device region in a semiconductor substrate and isolation regions adjacent to the device region, the device region having a channel region and the isolation regions having strain-inducing regions laterally adjacent to the channel regions, wherein each isolation region includes a trench filled with an amorphous semiconductor and each trench filled with the amorphous semiconductor has a top volume of the amorphous semiconductor extending across the trench, wherein the top volumes are adjacent to the device region and are the strain-inducing regions laterally adjacent to the channel regions;
  forming a semiconductor layer on the semiconductor substrate; and
  straining the channel region with a desired compressive strain for hole mobility enhancement, wherein straining the channel region includes adjusting the top volumes of the trenches filled with the amorphous semiconductor to provide the desired strain, and adjusting the top volumes includes:

implanting helium into the amorphous semiconductor to form a peak implant in the top volumes; and
annealing to form nanocavities in the top volumes.

54. The method of claim 53, wherein forming a semiconductor layer on the semiconductor substrate includes depositing an epitaxial semiconductor layer less than 1000 Å thick.

55. The method of claim 53, wherein implanting helium includes implanting helium with an energy to confine a helium implant peak to the semiconductor substrate within 100 Å from an interface between the substrate and the semiconductor layer.

56. The method of claim 53, further comprising forming a device, the device including the strained channel region.

57. A method, comprising:
defining a p-channel device region in a semiconductor substrate and first isolation regions adjacent to the p-channel device region and defining an n-channel device region in the substrate and second isolation regions adjacent to the n-channel device region, each of the p-channel and n-channel device regions having a channel region and each of the first and second isolation regions having strain-inducing regions laterally adjacent to the channel regions, wherein each of the first and second isolation regions includes a trench filled with an amorphous semiconductor and has a top volume of that includes the amorphous semiconductor extending across the trench, wherein the top volumes are adjacent to the device region and are the strain-inducing regions laterally adjacent to the channel regions;
straining the p-channel region with a desired compressive strain for hole mobility enhancement, wherein straining the p-channel region includes expanding the top volumes of the trenches filled with the amorphous semiconductor to provide the desired strain, and expanding the top volumes includes implanting at least one ion type with an energy resulting in a peak implant into the amorphous semiconductor in the top volumes of the trenches filled with the amorphous semiconductor adjacent to the p-channel device regions; and
straining the n-channel region with a desired tensile strain for electron mobility enhancement, wherein straining the n-channel region includes reducing the top volumes of the trenches filled with the amorphous semiconductor to provide the desired strain, and reducing the top volumes includes implanting at least one ion type with an energy resulting in a peak implant into the amorphous semiconductor in the top volumes of the trenches filled with the amorphous semiconductor adjacent to the n-channel device regions.

58. The method of claim 57, wherein implanting an ion type includes implanting helium in the strain-inducing regions of the first and second isolation regions, and annealing to form nanocavities.

59. The method of claim 58, further comprising implanting oxygen in the strain-inducing regions of the first isolation regions and annealing.

60. The method of claim 58, further comprising implanting argon in the strain-inducing regions of the second isolation regions and annealing.

61. The method of claim 60, further comprising, implanting hydrogen in the strain-inducing regions of the second isolation regions before annealing.

62. The method of claim 58, further comprising implanting oxygen in the strain-inducing regions of the first isolation regions, implanting hydrogen and argon in the strain-inducing regions of the second isolation regions, and annealing to form oxide in the strain-inducing regions.

63. A method, comprising:
defining a p-channel device region in a semiconductor substrate and first isolation regions adjacent to the p-channel device region and defining an n-channel device region in the substrate and second isolation regions adjacent to the n-channel device region, each of the p-channel and n-channel device regions having a channel region and each of the first and second isolation regions having strain-inducing regions laterally adjacent to the channel regions, wherein each of the first and second isolation region includes a trench filled with an amorphous semiconductor and each isolation region has a top volume of the amorphous semiconductor extending across the trench, wherein the top volumes are adjacent to the device region and are the strain-inducing regions laterally adjacent to the channel regions; and
straining the p-channel region with a desired compressive strain for hole mobility enhancement and straining the n-channel region with a desired tensile strain for electron mobility enhancement, wherein straining the p-channel region includes expanding the top volumes of the first isolation regions to provide the desired strain, and straining the n-channel region includes reducing the top volumes of the second isolation regions to provide the desired strain, wherein straining the p-channel region and the n-channel region includes:
implanting helium into the amorphous semiconductor in the strain-inducing regions of the first and second isolation regions, and annealing to form a peak density of nanocavities in the top volumes in the strain-inducing regions of the first and second isolation regions; and
implanting oxygen into the amorphous semiconductor in the strain-inducing regions of the first isolation regions, implanting argon and hydrogen into the amorphous semiconductor in the strain-inducing regions of the second isolation regions, and annealing to form an oxide in the strain-inducing regions of the first isolation regions and to recrystallize the strain-inducing regions of the second isolation regions.

64. The method of claim 63, wherein the strain-inducing regions have a depth of about 200 Å from a top surface of the isolation regions.

65. A method, comprising:
defining a p-channel device region in a semiconductor substrate and first isolation regions adjacent to the p-channel device region and defining an n-channel device region in the substrate and second isolation regions adjacent to the n-channel device region, each of the p-channel and n-channel device regions having a channel region and each of the first and second isolation regions having strain-inducing regions laterally adjacent to the channel regions, wherein each of the first and second isolation region includes a trench filled with an amorphous semiconductor and each isolation region has a top volume of the amorphous semiconductor extending across the trench, wherein the top volumes are adjacent to the device region and are the strain-inducing regions laterally adjacent to the channel regions;
forming a semiconductor layer on the semiconductor substrate; and
straining the p-channel region with a desired compressive strain for hole mobility enhancement and straining the n-channel region with a desired tensile strain for electron mobility enhancement, wherein straining the p-channel region includes expanding the top volumes of the first isolation regions to provide the desired strain, and straining the n-channel region includes reducing the top volumes of the second isolation regions to provide the desired strain, wherein straining the p-channel region and the n-channel region includes:

implanting helium into the amorphous semiconductor to form a peak implant in the top volumes in the strain-inducing regions of the first isolation regions, and implanting argon and hydrogen through the semiconductor layer into the amorphous semiconductor to form a peak implant in the top volumes in the strain-inducing regions of the second isolation regions; and annealing to form nanocavities in the strain-inducing regions of the first isolation regions and to recrystallize the strain-inducing regions of the second isolation regions.

66. The method of claim 65, wherein forming a semiconductor layer on the semiconductor substrate includes depositing an epitaxial semiconductor layer less than 1000 Å thick.

* * * * *

UNITED STATES PATENT AND TRADEMARK OFFICE
CERTIFICATE OF CORRECTION

PATENT NO. : 7,968,960 B2
APPLICATION NO. : 11/506986
DATED : June 28, 2011
INVENTOR(S) : Arup Bhattacharyya et al.

It is certified that error appears in the above-identified patent and that said Letters Patent is hereby corrected as shown below:

In column 17, lines 25-26, in Claim 57, after "of" delete "that includes".

Signed and Sealed this
Sixteenth Day of August, 2011

David J. Kappos
*Director of the United States Patent and Trademark Office*